United States Patent
Kushner et al.

(10) Patent No.: US 9,509,136 B2
(45) Date of Patent: Nov. 29, 2016

(54) ESD PROTECTION SYSTEM, APPARATUS, AND METHOD WITH ADJUSTABLE TRIGGER VOLTAGE DECOUPLED FROM DC BREAKDOWN VOLTAGE

(71) Applicant: Peregrine Semiconductor Corporation, San Diego, CA (US)

(72) Inventors: Vadim Kushner, Solana Beach, CA (US); Erica Poole, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 128 days.

(21) Appl. No.: 14/642,595

(22) Filed: Mar. 9, 2015

(65) Prior Publication Data

US 2016/0268800 A1   Sep. 15, 2016

(51) Int. Cl.
*H02H 9/04* (2006.01)
*H01L 27/02* (2006.01)

(52) U.S. Cl.
CPC ............ *H02H 9/04* (2013.01); *H01L 27/0266* (2013.01)

(58) Field of Classification Search
CPC .............................. H02H 9/041; H02H 9/046
USPC .......................................................... 361/56
See application file for complete search history.

(56) References Cited

U.S. PATENT DOCUMENTS

| | | | |
|---|---|---|---|
| 7,115,951 B1* | 10/2006 | Vashchenko | H01L 29/4238 257/355 |
| 7,723,823 B2 | 5/2010 | Gill et al. | |
| 8,969,958 B1* | 3/2015 | Khemka | H01L 29/0847 257/341 |
| 8,987,818 B1* | 3/2015 | McGregor | H01L 29/402 257/341 |

OTHER PUBLICATIONS

SOFICS Solutions for ICs: Concept for body coupling in SOI MOS transistors to improve multi-finger triggering; EOS/ESD symposium 2006.*
Keppens, et al., "Concept for Body Coupling in SOI MOS Transistors to Improve Multi-Finger Triggering", Conference Paper, Solutions for ICs, EOS/ESD Symposium 2006.

* cited by examiner

*Primary Examiner* — Dharti Patel
(74) *Attorney, Agent, or Firm* — Jaquez Land Greenhaus LLP; Martin J. Jaquez, Esq.; Alessandro Steinfl, Esq.

(57) ABSTRACT

Systems, methods, and apparatus for ESD protection with adjustable trigger voltage decoupled from DC breakdown voltage for semiconductor devices including field effect transistors (FETs), and particularly to metal-oxide-semiconductors (MOSFETs) fabricated on silicon-on-insulator ("SOI") and silicon-on-sapphire ("SOS") substrates are described. The apparatus and method are configured to change reverse biased drain junctions which in turn can control the DC breakdown voltage and the trigger voltage.

47 Claims, 17 Drawing Sheets

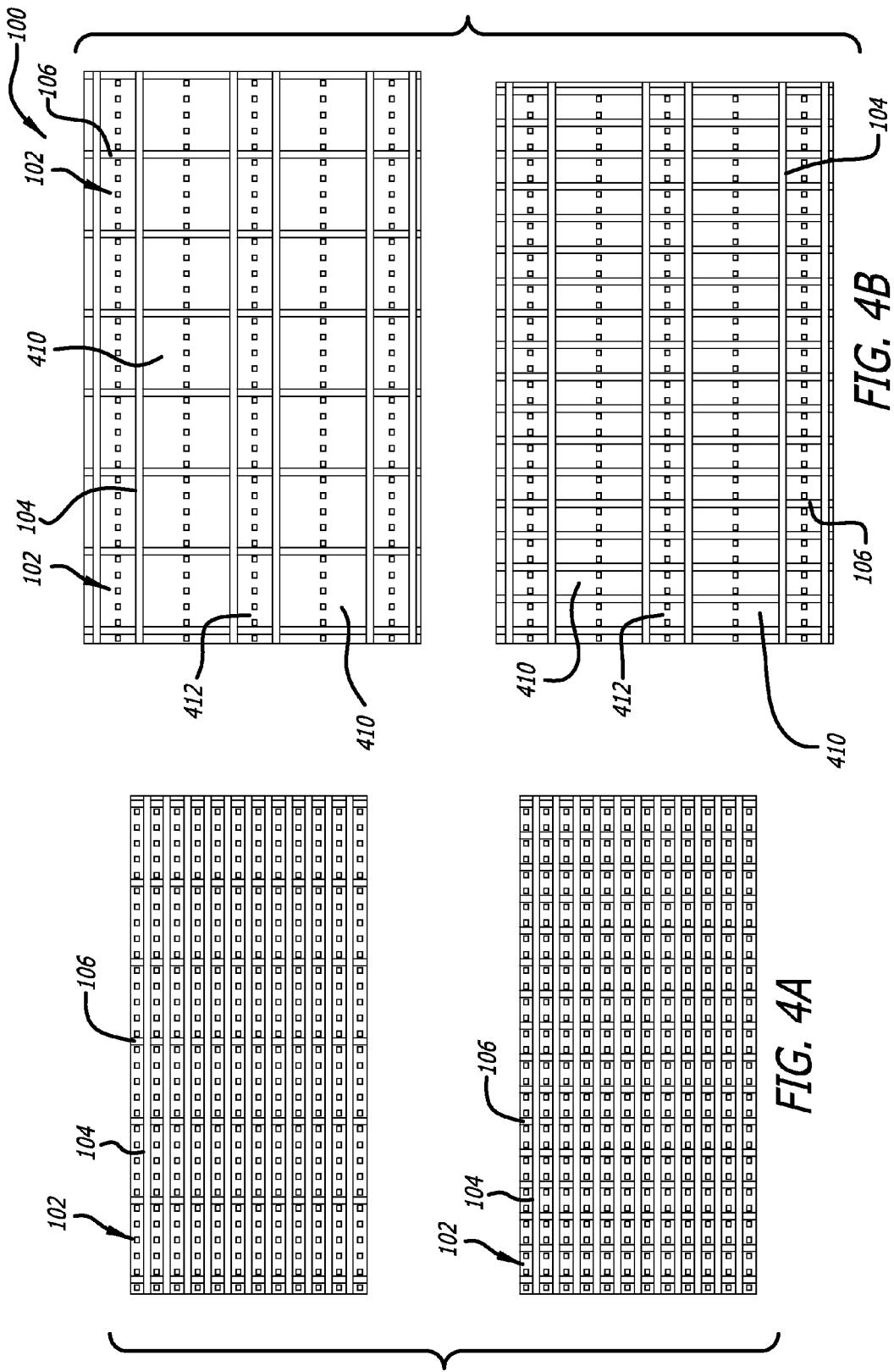

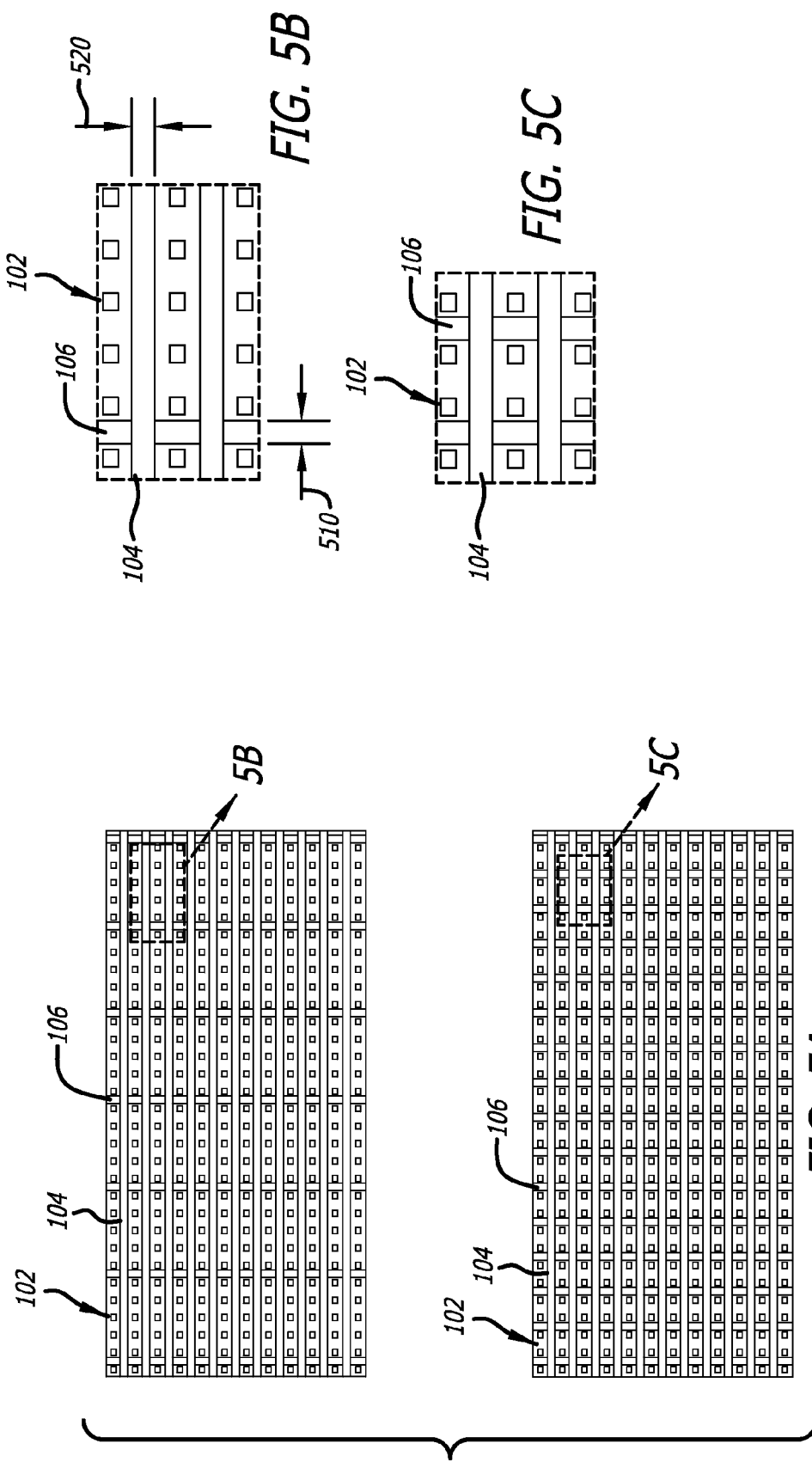

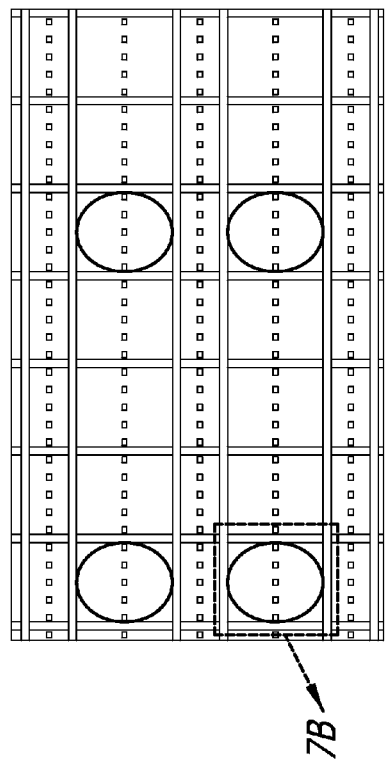
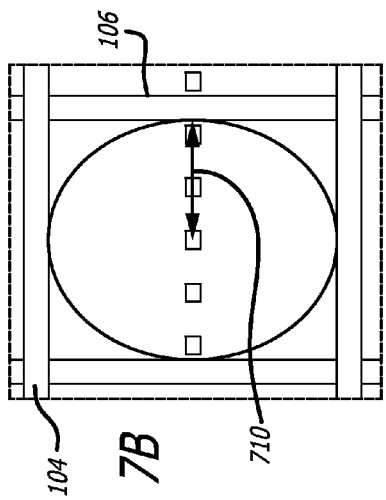
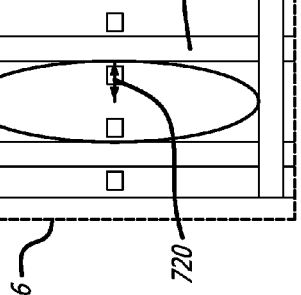
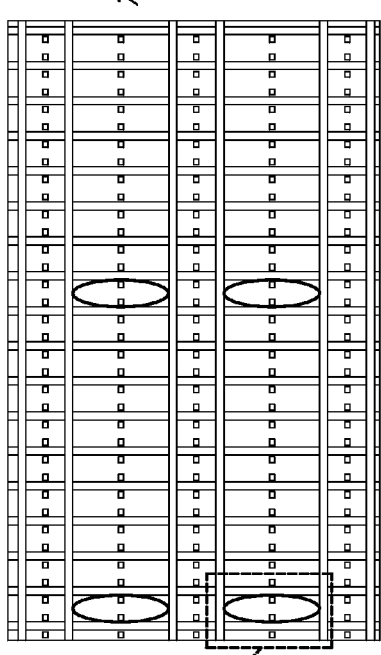
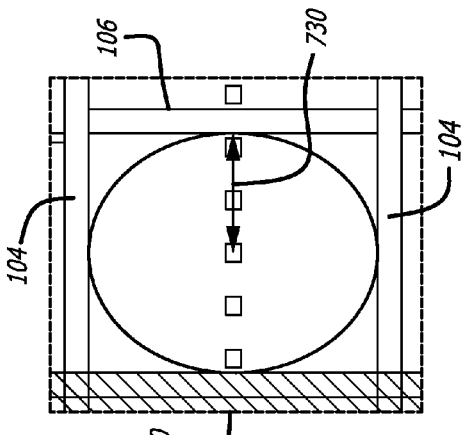
FIG. 7A
FIG. 7B
FIG. 7C
FIG. 7D

ESD PROTECTION SYSTEM, APPARATUS, AND METHOD WITH ADJUSTABLE TRIGGER VOLTAGE DECOUPLED FROM DC BREAKDOWN VOLTAGE

TECHNICAL FIELD

Various embodiments described herein relate generally to systems, methods, and apparatus for improving electrostatic discharge (ESD) performance for semiconductor devices.

BACKGROUND

It may be desirable to improve ESD performance for semiconductor devices used as ESD protection elements in radio frequency (RF) integrated circuits (ICs). Such semiconductor devices can include metal-oxide-semiconductor (MOS) field effect transistors (FETs), and particularly to MOSFETs fabricated on silicon-on-insulator ("SOI") and silicon-on-sapphire ("SOS") substrates.

SUMMARY

According to a first aspect of the present disclosure, an electrostatic discharge (ESD) protection device comprising a multiple fingers field-effect transistor (FET) is presented, the ESD protection device being configured to exhibit, during operation, a trigger voltage and a direct current breakdown voltage, wherein a finger of the multiple fingers FET comprises: a drain implantation region and corresponding drain contacts; a source implantation region and corresponding source contacts; a gate polysilicon region of length LG; and a plurality of transverse polysilicon stripes formed atop the drain implantation region and connected to the gate polysilicon region, and wherein: the gate length LG is chosen such that, during operation of the ESD protection device under an ESD event, a Zener breakdown mode of operation of the ESD protection device is provided, and a spacing between two consecutive transverse polysilicon stripes is configured to control the trigger voltage independently from the direct current breakdown voltage.

According to a second aspect of the present disclosure, a method for controlling a triggering voltage of an electrostatic discharge (ESD) protection device independently of a direct current breakdown voltage of the ESD protection device, the ESD protection device comprising a multiple fingers field-effect transistor (FET) is presented, the method comprising: forming, via a fabrication step of the FET, a plurality of transverse polysilicon stripes atop drain implantation regions of the FET; and controlling, via a spacing between two consecutive transverse polysilicon stripes, the triggering voltage independently of the direct current breakdown voltage.

According to third aspect of the present disclosure, an electrostatic discharge (ESD) protection device comprising a multiple fingers field-effect transistor (FET) is presented, the ESD protection device being configured to exhibit, during operation, a trigger voltage and a direct current breakdown voltage, wherein a finger of the multiple fingers FET comprises: a drain implantation region and corresponding drain contacts; a source implantation region and corresponding source contacts; a gate polysilicon region of length $L_G$; and at least one transverse polysilicon stripe formed atop the drain implantation region and connected to the gate polysilicon region, and wherein: the gate length $L_G$ is chosen such that, during operation of the ESD protection device under an ESD event, to provide a Zener breakdown mode of operation of the ESD protection device, and a position of the at least one transverse polysilicon stripe defined by an intersection of the at least one transverse polysilicon stripe with the gate polysilicon region is configured to control the trigger voltage independently from the direct current breakdown voltage.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 4A and 4B show planar views of transverse (vertical) polysilicon stripes of an SOI MOSFET device according to a prior art embodiment and according to various embodiments of the present disclosure respectively.

FIGS. 5A-5C show planar views and a cross section view of a prior art fully silicided SOI MOSFET device with transverse (vertical) polysilicon stripes.

FIGS. 7A-7D show curvatures of N+ drain to P-body junctions of a device (e.g. SOI MOSFET) with transverse (vertical) polysilicon stripes of different pitch length according to various embodiments of the present disclosure.

DETAILED DESCRIPTION

Figure 1A:
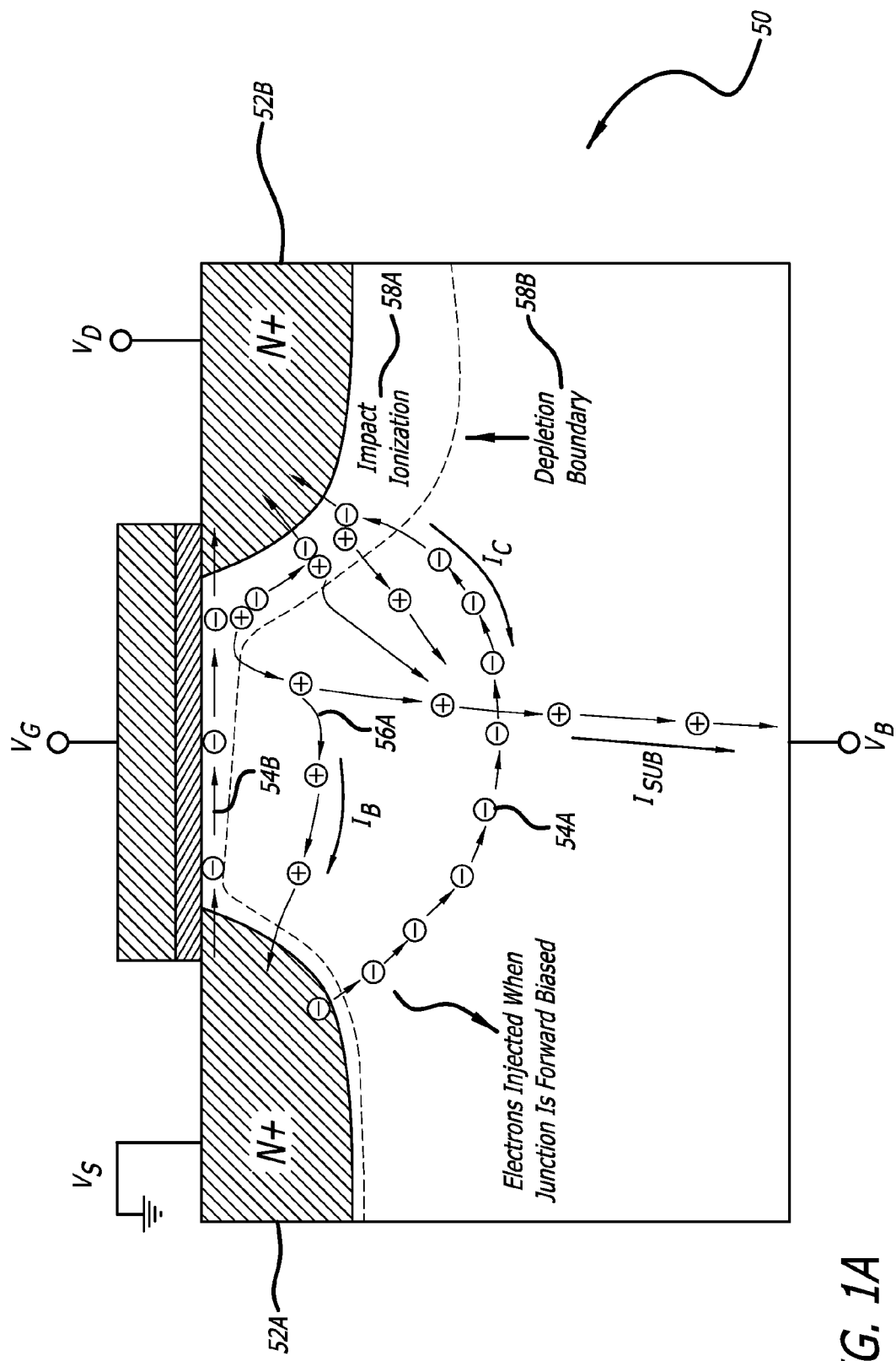
FIG. 1A is a simplified diagram of an electro-static discharge (ESD) strike effect to an N-type metal-oxide-semiconductor (NMOS) according to various embodiments.

Throughout this description, embodiments and variations are described for the purpose of illustrating uses and implementations of the inventive concept. The illustrative description should be understood as presenting examples of the inventive concept, rather than as limiting the scope of the concept as disclosed herein.

Integrated circuits (ICs) based on semiconductor devices can include electrostatic discharge (ESD) protection devices coupled to one or more pins of the ICs. Such ESD protection devices can include a semiconductor device (e.g. transistor) configured, during an ESD event, to conduct high transient currents resulting from discharge of electrostatic energy accumulated on a human body or on a machine or within the ICs. Energy from such electrostatic discharge events may be required or desired to be processed by the ESD protection devices without operatively damaging the ICs. System standards or specifications may require the IC, via its ESD protection devices, to withstand or dissipate ESD energy up to a predetermined voltage level.

An ESD protection system may include one or more ESD protection devices (e.g. semiconductor devices, transistors) and corresponding passive/reactive elements coupled to various pins of an IC in order to reduce the ESD energy transmitted during a transient ESD event to the IC and therefore protect the device (e.g. IC) per the requirements set forth by the system standards and specifications.

ESD performance of any semiconductor device may be evaluated by a corresponding voltage versus current response provided via a transmission line pulse (TLP) measurement method as known to a person skilled in the art. Such measurement method can provide current versus voltage (I-V) data in which each point of a corresponding plot is obtained from a pulse that reflects ESD characteristics waveforms. Notable parameters affecting effectiveness of an ESD protection device can be a corresponding triggering voltage and a corresponding leakage current at a circuit operating voltage. The triggering voltage can be representative of a minimum transient voltage which, when presented at input terminals of the ESD protection device during an ESD event, can trigger a conduction of the ESD protection device. Such triggering voltage, herein denoted Vt1, can be a function of an architecture/design of the semiconductor device and can be lower or higher than a direct current breakdown voltage (DCBV) of the ESD protection device. It may be desirable to have a consistent Vt1 voltage level such as triggering of the ESD protection device can be expected at a same given voltage level consistently, which can therefore allow for a more precise estimation of the ESD protection device application. It can also be desirable to have a reduced leakage current (e.g. a current through the ESD protection device when not triggered) such as to reduce a contribution to the power consumption of the IC by the ESD protection device and therefore reduce affecting of the operation of the IC under normal operating conditions.

Passive and/or reactive elements coupled to an ESD protection device can further affect performance and/or effectiveness of the protection device when used in an IC. In some cases such elements can affect operating speed or power consumption of an IC by, for example, providing a capacitive coupling (e.g. RC constant) to a control signal path of the IC, which for example, can control switching states of the IC and therefore an overall operating speed of the IC. Such degradations of IC performance due to the ESD protection device may therefore limit the use of the protection device in certain systems (e.g. ICs) including systems requiring higher operating speeds. Systems employing such ESD protection devices may be required to meet minimum operating speeds including systems generating or modulating radio frequency (RF) signals. RF signal systems may be subject to one or more standard or communication regulations as known to the person skilled in the art of RF communication systems. Such RF signal systems can include, for example, cellular communication systems and other similar portable devices.

Some semiconductor devices have been developed that may discharge or absorb ESD energy while not getting damaged, and therefore can be used as ESD protection devices. Such semiconductor devices used as ESD protection devices may have a corresponding triggering voltage Vt1 which is lower or higher than the devices direct current breakdown voltage (DCBV). Such semiconductor devices used as ESD protection devices may include semiconductor devices formed on bulk silicon or silicon-on-insulators (SOI), including field effect transistors (FET). The FET devices may include complementary metal-oxide-semiconductor (CMOS), metal-oxide-semiconductor field-effect transistor (MOSFET), and other type field-effect transistor (FET) devices. The silicon-on-insulator (SOI) may include silicon-on-sapphire (SOS) in an embodiment.

FIG. 1A is a simplified diagram of an electro-static discharge (ESD) strike effect (e.g. ESD transient event) to an N-type metal-oxide-semiconductor (NMOS) 50 according to various embodiments. As shown in FIG. 1A, during an ESD event a MOSFET 50 may form an effective bipolar transistor (BJT) and conduct ESD energy via a current, $I_C$. This BJT can be formed in the body of the NMOS below the transistor gate normal operating region 54B. Such current $I_C$ formation via impact ionization 58A may protect the operative transistor body area near the gate region 54B, source region 52A, and drain region 52B during an ESD event. The effective Drain-to-Gate parasitic capacitance (Cgd not shown) of such transistor coupled with the gate to source resistance and the transistor's physical construction (width, length, and number of fingers for gate, source, drain, and body) can be used to modify performance of this device during ESD events and under normal operations.

With further reference to FIG. 1A, the FET semiconductor device (50) may be able to dissipate or conduct ESD energy via a conduction channel 54A below the operative or normal conduction channel 54B as shown in FIG. 1A. The ESD event voltage level required to trigger the dissipation operation mode can be the ESD triggering voltage Vt1 built up between the drain and the source terminals of the FET (50) during an ESD event. The FET semiconductor device (50) may also have a breakdown mode where it undesirably transfers energy through the normal conduction channel 54B. The FET semiconductor device may operate in the breakdown mode when a signal having a voltage level greater than the direct current (DC) breakdown voltage is seen by the device (e.g. across its drain and source terminals). A semiconductor device such as the FET (50) of FIG. 1A can be used as an ESD protection device.

Figure 1B:
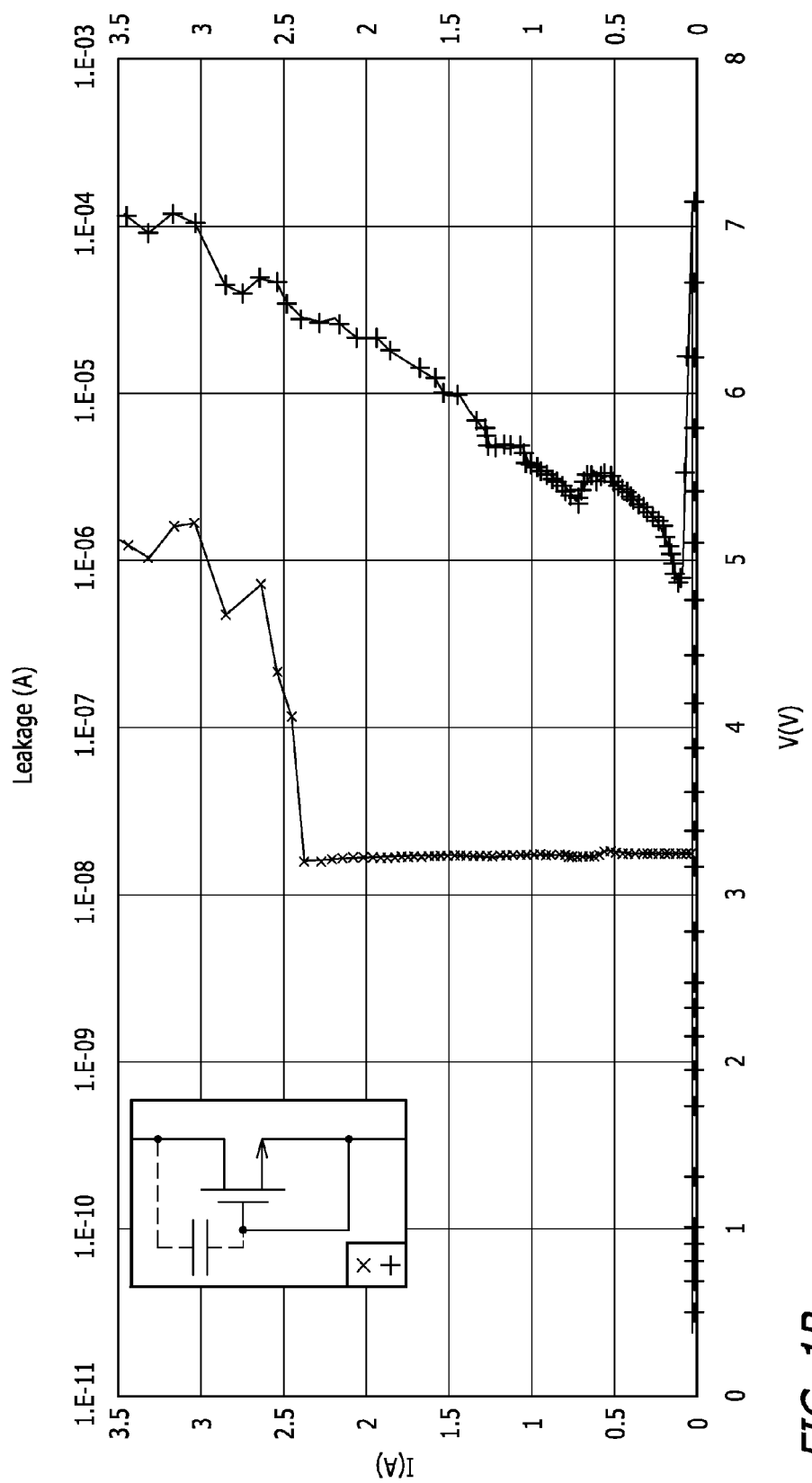
FIGS. 1B-1E represent simplified block diagrams of ESD protection semiconductor device architectures, some with additional ESD protection components, according to various embodiments. Graphs representing performance of such ESD architectures via transmission line pulse measurement are also provided.
Figure 1C:
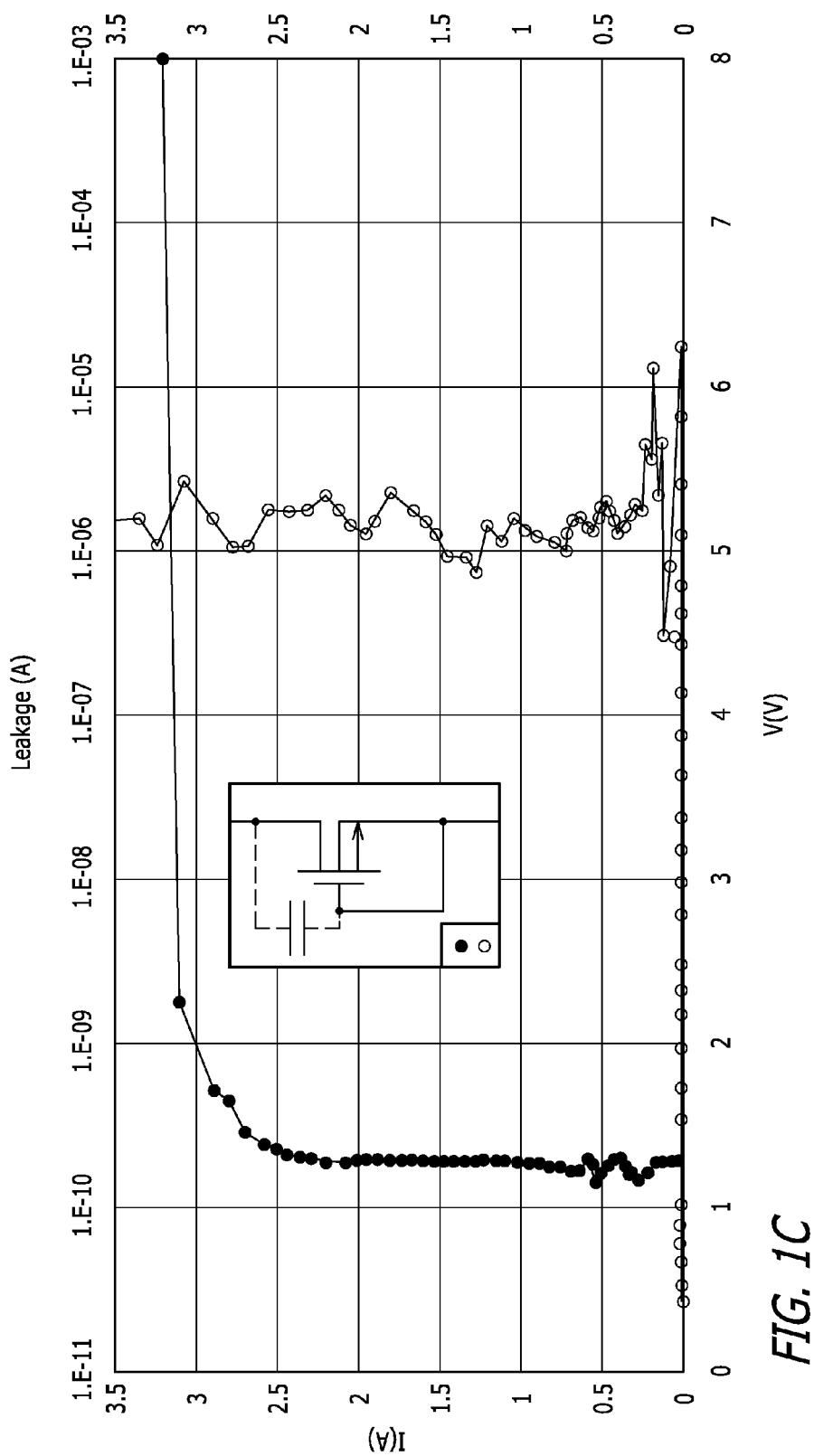
Figure 1D:
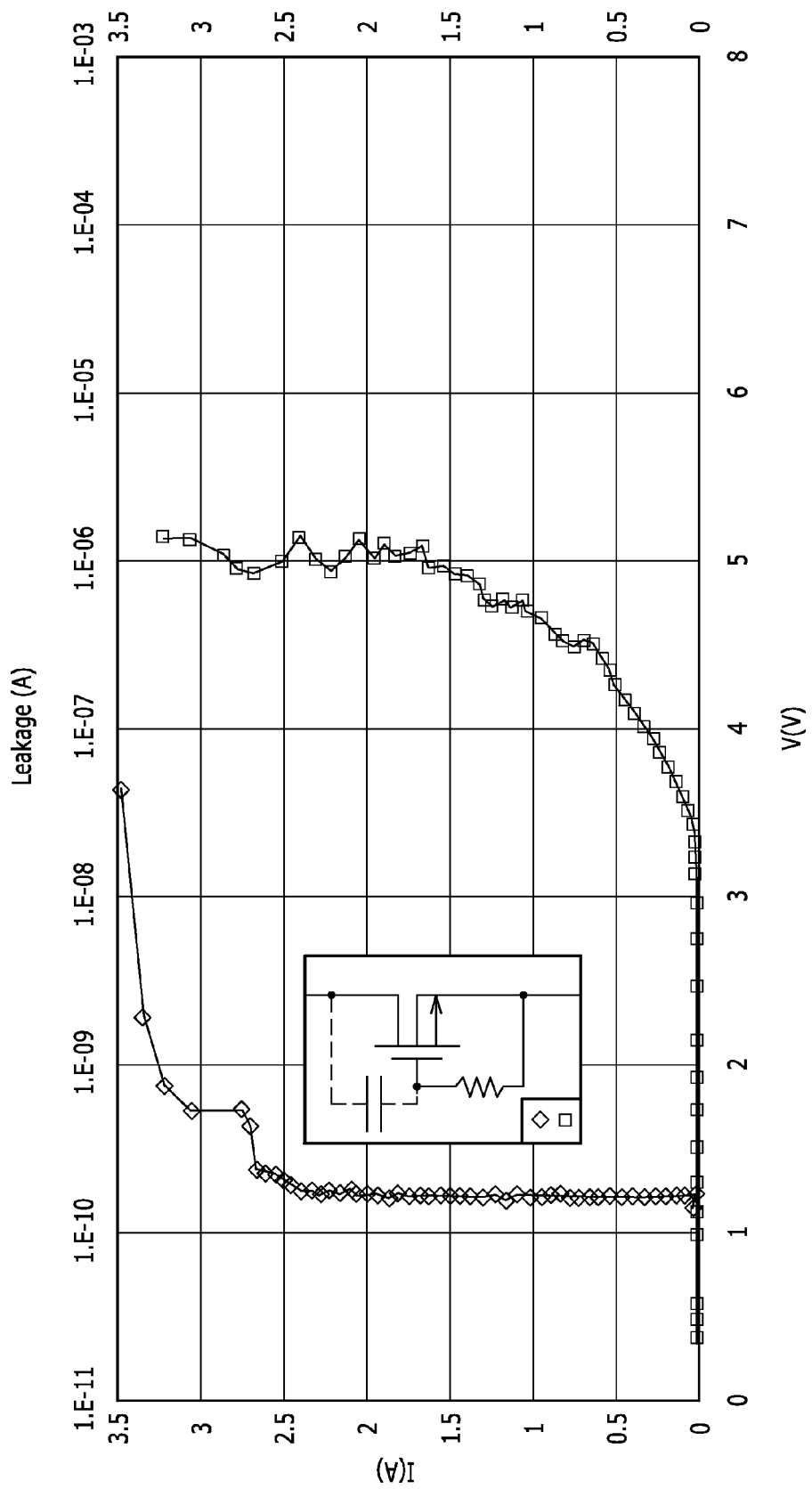
Figure 1E:
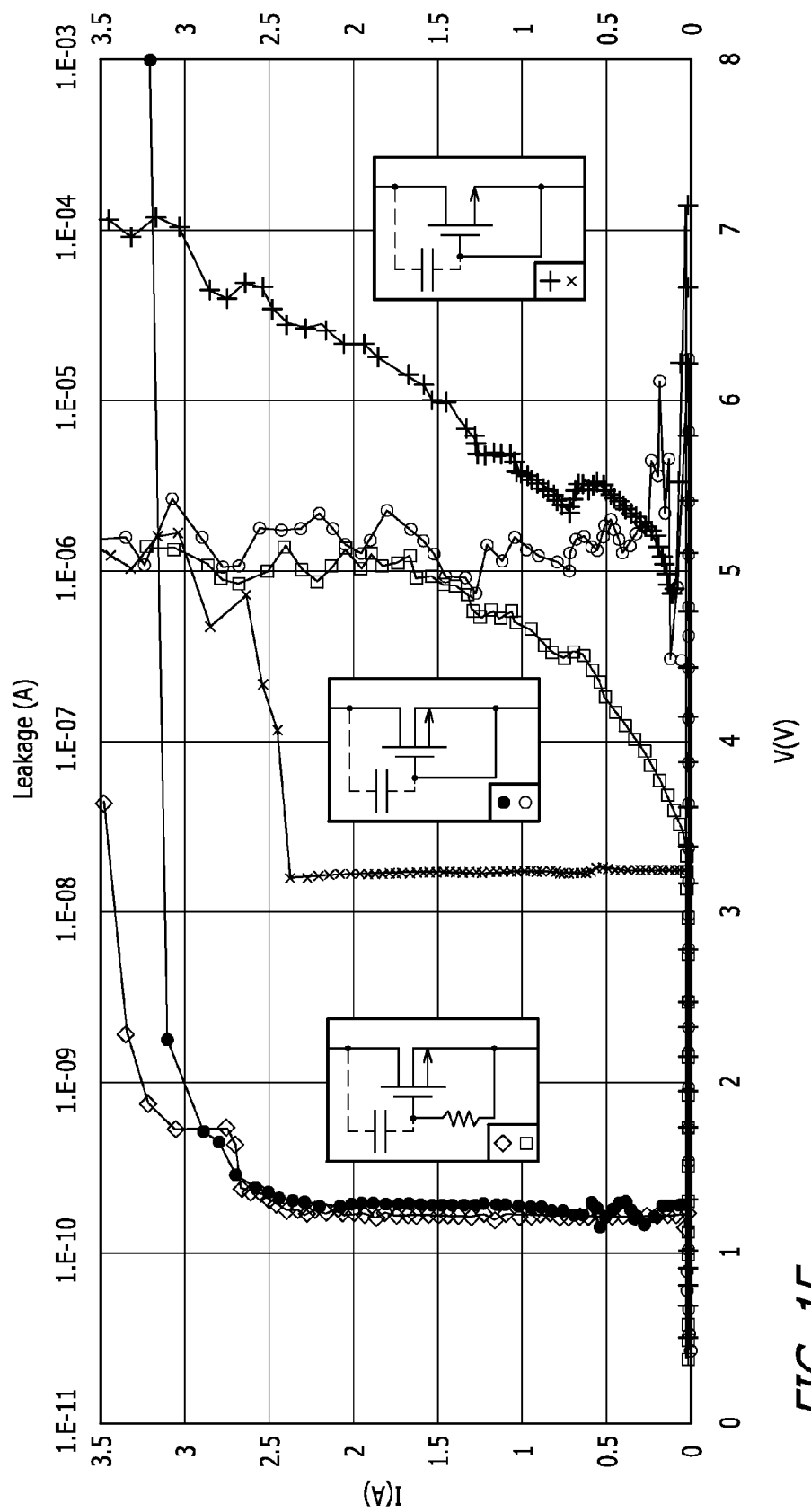

FIGS. 1B-1D show various exemplary ESD protection devices and corresponding (I-V) plots (i.e. triggering voltage and leakage current) obtained via TLP measurements. These devices include a transistor device (e.g. N-type MOSFET) which may have a resistor connected between the gate and the source. Such ESD protection devices can dissipate energy corresponding to an ESD event coupled between the drain terminal (e.g. high voltage terminal) and the source terminal (e.g. low voltage terminal) of the transistor device. The transistor device can have a body connection which can connect, for example, a corresponding transistor device substrate to a source terminal of the transistor (e.g. a P-type body connection). FIG. 1E includes all the plots of FIGS. 1B-1D in one figure for ease of ESD performance comparison of the corresponding ESD protection device.

In addition to the corresponding TLP measurement plots, as depicted, for example, in FIGS. 1B-1D, effectiveness of such ESD protection devices can be further limited by their inherent direct current breakdown voltages (DCBVs). Such DCBV voltage is indicative of a high current mode of operation of the transistor device triggered by a high direct current (DC) voltage condition provided across two terminals (e.g. drain and source) of the ESD device. Such DCBV voltage can be larger or smaller than the triggering voltage Vt1 of the ESD device. In a case where the triggering voltage Vt1 is higher than the DCBV voltage, the ESD device can still absorb an ESD event characterized by its transient electrical behavior while being subjected, during a very short time (e.g. less than 1 µs), to a voltage higher than its Vt1 and DCBV voltages. Operating a device at a voltage higher than its DCBV voltage for a longer period of time (e.g. greater than 1 µs) can cause thermal meltdown/destruction of the device. Therefore, it can be desirable for an ESD device to have a Vt1 which is smaller than a corresponding DCBV voltage. It can also be desirable to have an ESD device with a Vt1 as small as possible such as to, for example, allow for larger design margins between internal circuit components trigger voltages and the ESD protection trigger voltage Vt1. As known to the person skilled in the art, an electric field breakdown in an active device (e.g. transistor) can be due to different internal processes, such as a punch-through breakdown, a Zener breakdown or an avalanche breakdown, which can be a function of the device's design parameters and architecture. For example, as known to the person skilled in the art, breakdown in shorter gate lengths transistors can be a punch-through breakdown, whereas breakdown in transistors with larger gate lengths can be a Zener or avalanche breakdown. In other words, gate length of a transistor can define a corresponding type of breakdown (e.g. punch-through, Zener, avalanche). Also as known to the skilled person, a punch-through DCBV voltage of a device is smaller than the Zener DCBV voltage of the device, which in turn is smaller than an avalanche DCBV voltage of the device.

Table 1 below shows the DCBV, leakage current and Vt1 for the ESD protection devices (Clamps) of FIGS. 1B-1D, where the DCBV is measured for a 1 µA current, and the leakage current is measured at 3.6 V.

TABLE 1

Room Temperature TLP and DCBV Summary

| Clamp | DCBV(V) at 1 µA | Vt1(V) | I-leak(nA) at 3.6 V |
|---|---|---|---|
| FIG. 1B: High Vt1/High I-leak | 4.2 | 7.2 | 20 |
| FIG. 1D: Low Vt1/Low I-leak/High RC | 6.3 | 3.7 | 0.2 |
| FIG. 1C: High Vt1/Low I-leak/ Inconsistent Vt1 | 6.4 | 6.2 | 0.2 |

The exemplary ESD protection device depicted in FIG. 1B comprises a transistor device (e.g. FET, MOSFET on SOI) with a gate terminal connected to its source terminal. A capacitor shown between the gate terminal and the drain terminal is a parasitic drain-to-gate or $C_{DG}$ capacitance of the device (e.g. MOSFET). Such parasitic capacitance can be made to be of a desired value via transistor design parameters and can affect ESD performance by modifying a corresponding RC time constant. The transistor device of FIG. 1B does not include a body connection. As depicted in FIG. 1B, TLP measurements of such ESD device ("+" for triggering voltage, "x" for leakage current) show a relatively high triggering voltage (Vt1) (e.g. ~7.2V). This means that the ESD protection circuit of such device will trigger before internal circuits with trigger voltage higher than 7.2V. As seen in the data provided in Table 1, the ESD protection device depicted in FIG. 1B shows a relatively large leakage current of about 20 nA for a 3.6V level applied at the terminals of the ESD device. This may prevent use of this ESD protection in applications that require low static current. Also, as seen in the data provided in Table 1, the ESD protection device depicted in FIG. 1B has a DCBV voltage of about 4.2V (at 1 µA). This means that ESD protection of such devices can be used only for operating voltages lower than 4.2V without drawing more than 1 µA.

The exemplary ESD protection device depicted in FIG. 1C comprises a transistor device (e.g. MOSFET) with a gate terminal connected to its source terminal. A capacitor shown between the gate terminal and the drain terminal is the (inherent) parasitic $C_{DG}$ capacitance of the device. Such transistor device has similar connections as the transistor device used in the exemplary ESD protection device of FIG. 1B with the addition of a body connection, which connects the transistor's substrate to the source terminal of the transistor. TLP measurements of such ESD device ("○" for triggering voltage, "●" for leakage current) show a relatively high and inconsistent triggering voltage (Vt1) and a reduced leakage current (e.g. 0.2 nA at 3.6 V, per Table 1) relative to the leakage current of the exemplary device depicted in FIG. 1B. Inconsistent triggering voltage can be attributed to the multi-finger configuration of the transistor device where various fingers can be triggered (e.g. into conduction) at different times and therefore not simultaneously. The person skilled in the art readily knows that the non-smooth nature of the voltage across the protection device depicted in the TLP plot of FIG. 1C (e.g. I-V plot) is due to an event known as snap-back, where a non-conducting finger of the device enters a conduction mode. It can be desirable for all fingers of the transistor device to consistently trigger at a same time and at a same triggering voltage level (e.g. no multiple snap-back condition visible on a corresponding current versus voltage plot), as fingers triggered at an earlier time may get damaged due to excessive current load through those fingers. The person skilled in the art readily knows the concept of multi-finger architecture as used in a transistor design, fabricated, for example, in bulk or SOI MOS technologies. The ESD protection device depicted in FIG. 1C has a DCBV voltage of about 6.3 V, which is larger than the DCBV voltage of the ESD device of FIG. 1B. The DCBV voltage of the ESD protection device depicted in FIG. 1C can be higher or lower than its triggering voltage due to the inconsistency in value of Vt1.

The exemplary ESD protection device depicted in FIG. 1D comprises a transistor device with a gate terminal coupled to its source terminal via a series-connected resistor. A capacitor shown between the gate terminal and the drain terminal is the parasitic $C_{DG}$ capacitance of the device. The transistor device of FIG. 1D further includes a body connection connecting its substrate to its source terminal. The ESD protection device depicted in FIG. 1D can be derived by its counterpart depicted in FIG. 1C with the addition of the resistor between the gate and the source terminals. TLP measurements of such exemplary ESD device depicted in FIG. 1D ("□" for triggering voltage, "◊" for leakage current) show a reduced triggering voltage (Vt1) (e.g. ~3.7 V) and a reduced leakage current of about 0.2 nA (at 3.6 V per Table 1). The ESD protection device depicted in FIG. 1D has a DCBV voltage of about 6.4V, which is substantially larger than the triggering voltage (e.g. 3.7 V) of the ESD device (see Table 1). Difference in values between Vt1 and DCBV voltages can provide a desired design margin for usage of such device as an ESD protection device of, for example, an IC. Although the ESD protection device depicted in FIG. 1D can have desirable triggering voltage and leakage current values, the combination of the resistor and the capacitor coupled to the transistor device provides an RC time constant which can reduce an operating speed of a system (e.g. RF IC) using such ESD protection device. In the exemplary embodiments of the ESD device depicted in FIG. 1D, the series resistor can be about 5K Ohms, and therefore the RC constant provided by such configuration can be about 5000 times larger than an RC constant provided by the exemplary ESD devices depicted in FIGS. 1B-1C.

As noted in the prior sections of the present disclosure, the exemplary ESD devices of FIGS. 1B-1D are each limited in their performances, such as high leakage current (e.g. FIG. 1B), high Vt1 (e.g. FIGS. 1B-1C), inconsistent Vt1 (e.g. FIG. 1C) and high RC constant (e.g. FIG. 1D). It is therefore an objective of the present disclosure to provide devices and corresponding fabrication methods based on known transistor technologies for use as ESD protection devices with reduced leakage current, reduced and consistent triggering voltage (e.g. relative to DCBV voltage) and reduced RC time constant. According to some embodiments of the present disclosure, such transistor technologies can comprise FETs and MOSFETs fabricated via SOI technology, such as, for example SOS. According to various embodiments of the present disclosure, such ESD protection devices can be obtained by reducing a triggering voltage (Vt1) of an ESD device (e.g. FIG. 1C) while maintaining a substantially same direct current breakdown voltage (DCBV) value. Such ESD protection devices according to the various embodiments of the present disclosure can be used in high frequency (e.g. 500 MHz-10 GHz) RF ICs which require ESD protection devices with low RC constant.

According to an embodiment of the present disclosure, a triggering voltage of an ESD protection device can be reduced without substantially reducing a direct current breakdown voltage of the device. According to an exemplary embodiment, the ESD protection device can be similar in design to the ESD protection device depicted in FIG. 1C, where the triggering voltage Vt1 is further reduced to a consistent level substantially below the DCBV voltage of the device by modifying the design of the corresponding transistor device. Such design modification of the transistor device can also provide a consistent triggering of all fingers of the transistor device which can allow equal distribution of the energy of an ESD transient event across all fingers of the transistor device, and therefore can improve the robustness of the ESD protection device (e.g. survivability of the ESD protection device). According to some embodiments of the present disclosure the transistor device can be a body coupled FET transistor, such as, for example, an SOI MOSFET, comprising a plurality of fingers. As used in the present disclosure, body coupling, or transverse body coupling, is referred to as transverse coupling of the bodies (e.g. P-body) of two adjacent fingers by providing one or more transverse P-type connections (conduction channels) between the bodies of the two fingers. The transverse polysilicon stripes according to the various embodiments of the present disclosure, and later described, allow for such transverse coupling of a body coupled transistor. As known to the person skilled in the art, a multiple finger configuration can change a device's aspect ratio which can therefore reduce the device's overall physical area while maintaining a desired total width associated to a desired ESD robustness of the device. As previously mentioned, full advantage (e.g. increased robustness) of such multiple finger configuration can be obtained when all the fingers are simultaneously triggered during an ESD event.

Semiconductor devices with multiple fingers may fail to distribute ESD energy across its fingers depending on their physical configuration. For example, a multiple fingers SOI semiconductor device with fully silicided gates may fail to equally distribute ESD energy across its multiple fingers. As used in the present disclosure, a finger of a semiconductor device can comprise a gate polysilicon region, a drain region with corresponding contacts and a source region with corresponding contacts. Various views of an exemplary fully silicided gate SOI device with multiple fingers are depicted in FIGS. 2A-2D. As shown in FIG. 2C a finger of such SOI device can be isolated from a neighboring finger via a buried oxide (BOX) layer formed in the semiconductor substrate, and therefore no substrate current can be provided from a triggered finger to the neighboring finger. Lack of such substrate current in an SOI device can prevent simultaneous triggering of all fingers of the device. The skilled person realizes that in a case of a transistor device fabricated using a non-SOI bulk technology, current through the common substrate shared with adjacent fingers from a triggered finger can help to trigger adjacent fingers.

Figure 2A:
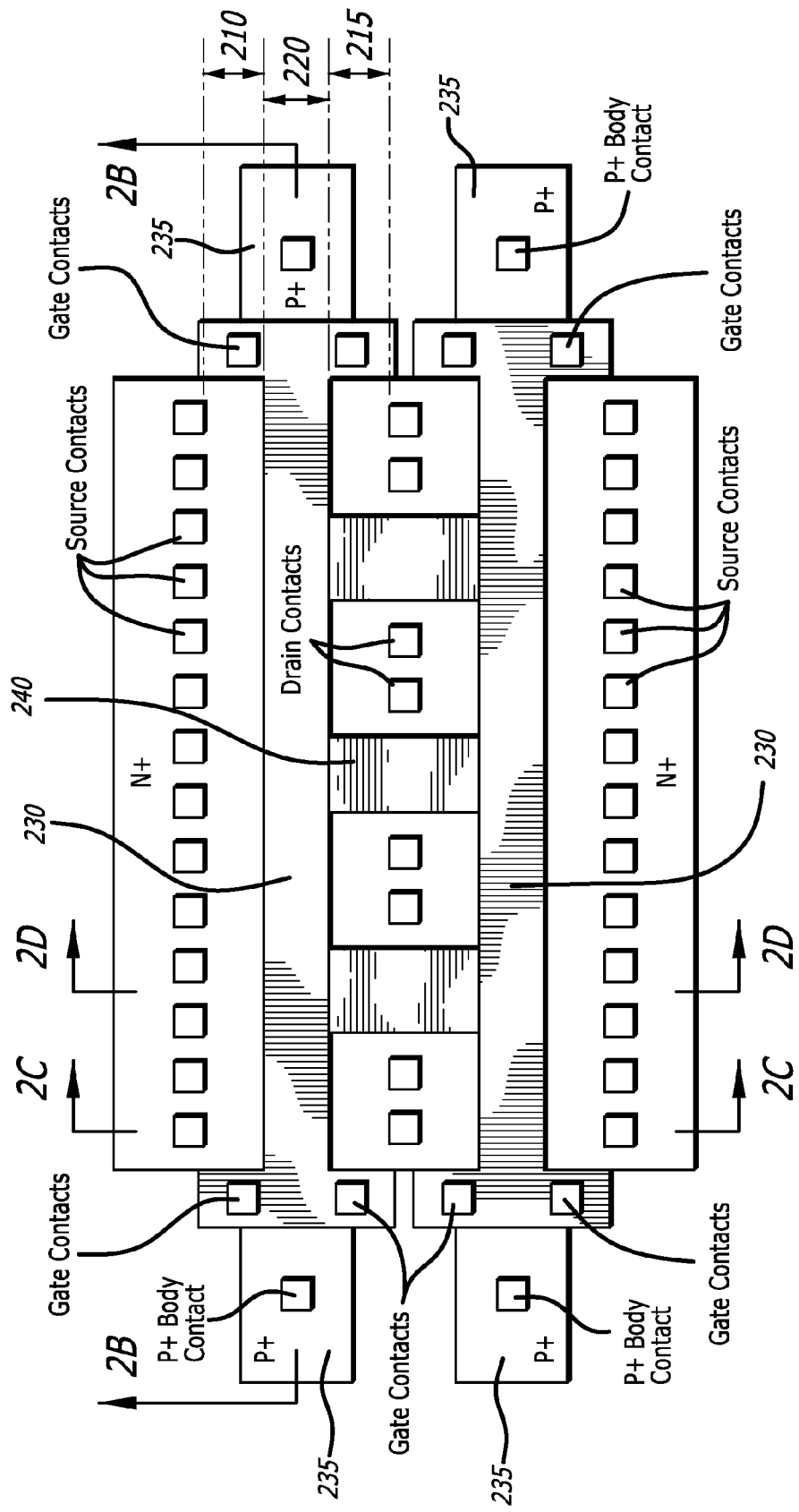
FIGS. 2A-2D show a planar view and various corresponding cross section views of a prior art multiple fingers semiconductor device with fully silicided gates, where the cross section references, used as figure numbers of the figures with the cross section views, are indicated in the figure with the planar view.
Figure 2B:
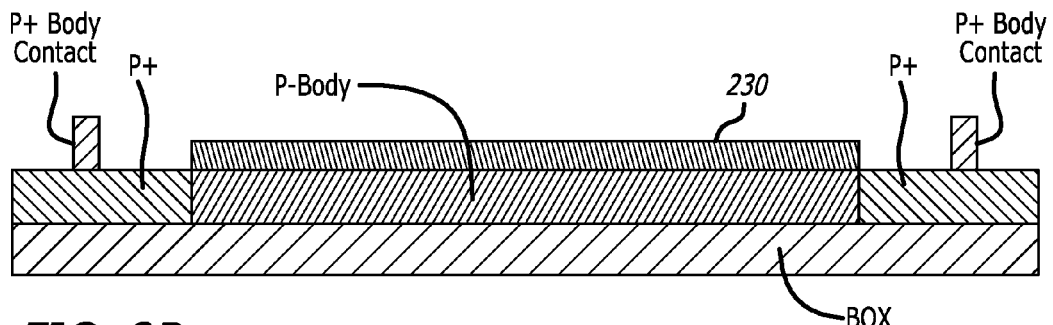
Figure 2C:
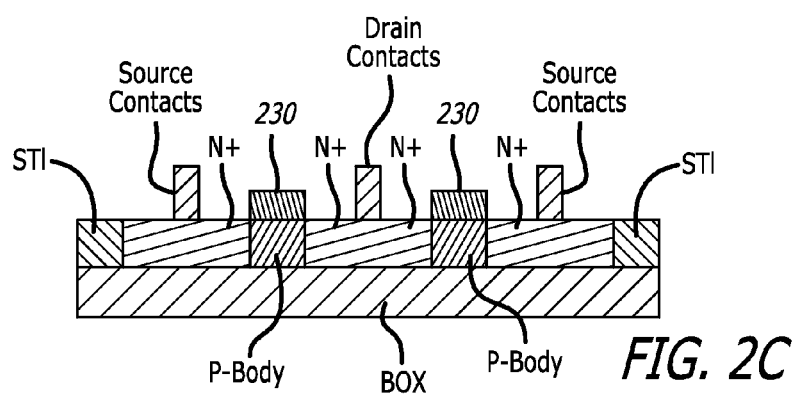

According to a prior art embodiment, inconsistent triggering of a multiple fingers device, such as an SOI device, can be addressed via addition of transverse polysilicon stripes (240) joining the polysilicon gates (230) as depicted in FIG. 2A. During processing of a FET device, the polysilicon gates (230) and the transverse polysilicon stripes (240) included in a corresponding processing mask may prevent the implantation of N+ into a P− body of the FET device (e.g. SOI FET) and therefore provide a P-conduction channel between the various fingers of the device. Such transverse polysilicon stripes can therefore restore a (transverse) body coupling between the multiple fingers of the FET device. More information on such concept can be found, for example, in a paper by Bart Keppens, Geert Wybo, Gerd Vermont, and Benjamin Van Camp, entitled "*Concept for Body Coupling in SOI MOS Transistors to Improve Multi-Finger Triggering*", presented at EOS/ESD symposium 2006 (Keppens hereinafter) document, which is included by reference herein in its entirety. To be noted that as used in the present disclosure, the terms polysilicon stripes, transverse polysilicon stripes and vertical polysilicon stripes all refer to the same stripes and are different from the gate polysilicon known to the person skilled in the art. In a planar view of a corresponding semiconductor device, such as for example, depicted in FIGS. 6A-6C, the gates (104) can be seen as horizontal regions and the transverse polysilicon stripes (106) can be seen as vertical stripes which appear to cross the horizontal gates (refer to section below describing FIG. 5B).

In the prior art embodiment (e.g. Keppens) of the transverse body coupled SOI MOSFET whose planar view and cross sections are depicted in FIGS. 2A-2D, the small spacing (e.g. of about 100 nm) between the drain and the source implantations (e.g. N+), denoted as (220) in the FIG. 2A, can provide a punch through breakdown mode of operation of the device. This spacing (220) is defined by the MOSFET gate length $L_G$ which can be defined as the dimension of the gate polysilicon (230) in the direction of the drain to source. The skilled person is well aware of such mode of operation, where such small spacing (220) between the drain and the source implantations can cause the depletion layers around the drain and source regions to merge into a single depletion region. DCBV voltage of ESD devices triggered by punch-through phenomena is coupled to the device trigger voltage Vt1 that reduces allowed operating voltage of such components and leaves no margin for use as an ESD clamp. In other words, a punch-through triggered ESD device (e.g. clamp) can have a lower DCBV voltage which can limit its use. For this reason the previous art [1] coupled body devices are utilized only as self-protecting components, which means that they do not require any additional/separate ESD protection devices.

The exemplary prior art embodiment, whose planar view is depicted in FIG. 2A, also uses a symmetrical drain and source spacing with respect to the gate. Such symmetrical configuration, where gate to source distance (210) equals gate to drain distance (215), can use a reduced spacing between either or both the source and drain contacts to the (horizontal) gate polysilicon (e.g. polycrystalline silicon) (230) as depicted in FIG. 2A.

Figure 2D:
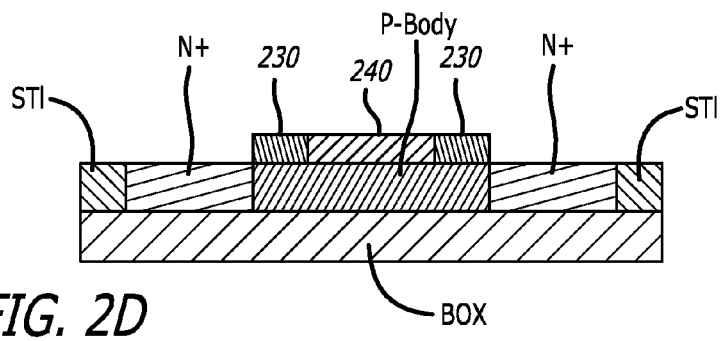

Furthermore, the prior art transverse body coupled SOI MOSFET (e.g. Keppens) depicted in FIGS. 2A-2D is fully silicided, where corresponding gate, source and drain are silicided. Such silicidation can cause current crowding (e.g. at the vicinity of corresponding contacts) and current filamentation during an ESD event which can further limit effectiveness and robustness of such SOI MOSFET for use as an ESD protection device. As known to the person skilled in the art, shallow trench isolation (STI) regions of silicon dioxide shown in FIGS. 2D and 2E are used for isolation between integrated circuit components.

With further reference to the prior art embodiment depicted in FIGS. 2A-2D, various contacts corresponding to the various regions of the device (e.g. SOI MOSFET) are also depicted. These include the gate contacts associated to the polysilicon gate (230), the drain and source contacts, as well as the P+ body contacts associated to the P+ region (235) of the device.

Figure 3A:
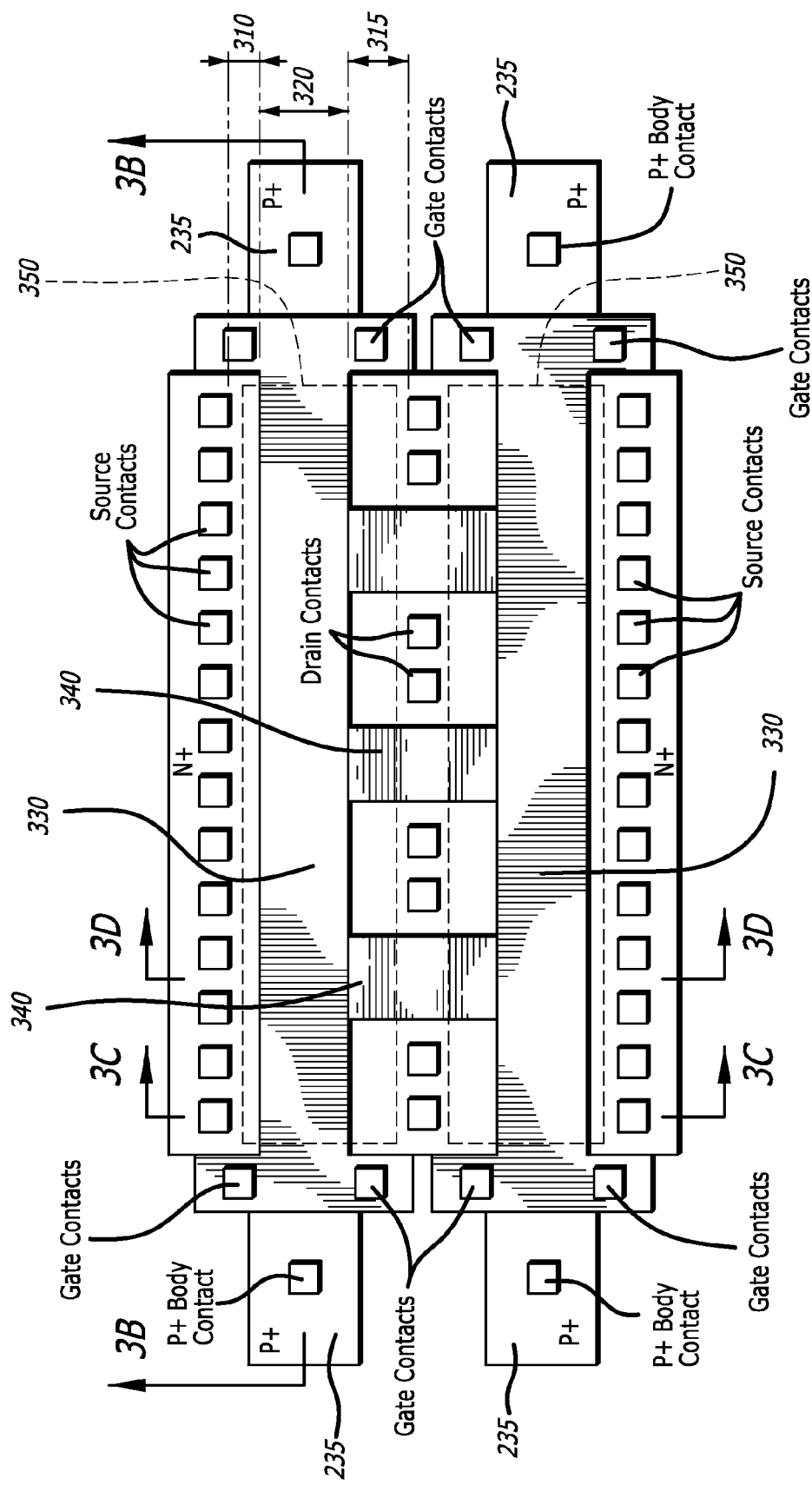
FIGS. 3A-3D show a planar view and various corresponding cross section views of a transverse body coupled N-type SOI MOSFET according to various embodiments of the present disclosure, where the cross section references, used as figure numbers of the figures with the cross section views, are indicated in the figure with the planar view.

FIG. 3A depicts a planar (top) view of a transverse body coupled SOI MOSFET according to various embodiments of the present disclosure, which can address some of the limitations of the prior art embodiment depicted in FIGS. 2A-2D as described in the previous paragraphs of the present disclosure.

According to an embodiment of the present disclosure as depicted in FIG. 3A, a larger spacing (320) between the drain and the source implantations (e.g. N+ regions) is provided. This spacing (320) is defined by the MOSFET gate length $L_G$. In an exemplary embodiment according to the present disclosure such gate length $L_G$ can be about 400 nm. According to an embodiment of the present disclosure such spacing can be a minimum spacing required so as to produce a Zener breakdown mode of operation of the device when the device is subjected to an ESD event. At larger lengths the DCBV of a MOSFET can be increased up to the saturation value limited by the levels of N+ and P-well doping implantations. However, larger $L_G$ will also cause an increase in the trigger voltage $V_{t1}$ which will diminish this ESD clamp protection margin. Therefore, it can be desirable to use an additional ESD trigger mechanism, as per the embodiment according to the present disclosure depicted in FIG. 1D, to reduce ESD trigger voltage without impact on DCBV (e.g. maintain a higher DCBV voltage).

According to an embodiment of the present disclosure and with further reference to FIG. 3A, spacing (315) from the drain contacts to the gate polysilicon (330) can be about 3 times larger than the spacing (310) from the source contacts to the gate polysilicon (330). According to further exemplary embodiments of the present disclosure, such spacing (315) from the drain contacts to the gate polysilicon (330) can be between 2 to 6 times larger than the spacing (310) from the source contacts to the gate polysilicon (330). Such larger non-silicided spacing (e.g. obtained via silicide block mask) between the drain contacts and the gate polysilicon can create additional ballasting resistance that can reduce current crowding through the N+/P-well junction between the drain and the body. Furthermore, spacing (310) from the source contacts to the gate polysilicon (330) can be twice the spacing used in the prior art embodiment depicted in FIGS. 2A-2D. It should be noted that due to the "self-protective" approach taken in the design of the prior art embodiment (e.g. Keppens), minimum spacing can be desired so that to reduce output resistance of the device.

According to a further embodiment of the present disclosure, the transverse body coupled SOI MOSFET whose planar view is depicted in FIG. 3A (e.g. depicting one of many corresponding fingers) can be made with a silicide block mask so as to limit the silicide formation on a top surface of the device. As depicted in FIG. 3A, in one exemplary embodiment of the present disclosure, a silicide block mask (350) can block formation of the silicide layer on all top regions of the device except the drain and source contacts regions. Blocking of silicidation can create ballasting resistance at the blocked regions which can in turn prevent current crowding/filamentation and improve effectiveness and robustness of the device with respect to an ESD event. It should be noted that due to the "self-protective" approach taken in the design of the prior art embodiment (e.g. Keppens), a fully silicided device can be desired for such approach so as to improve device operating performance (e.g. operating speed provided by sheet resistance lowering via silicidation).

Figure 3B:
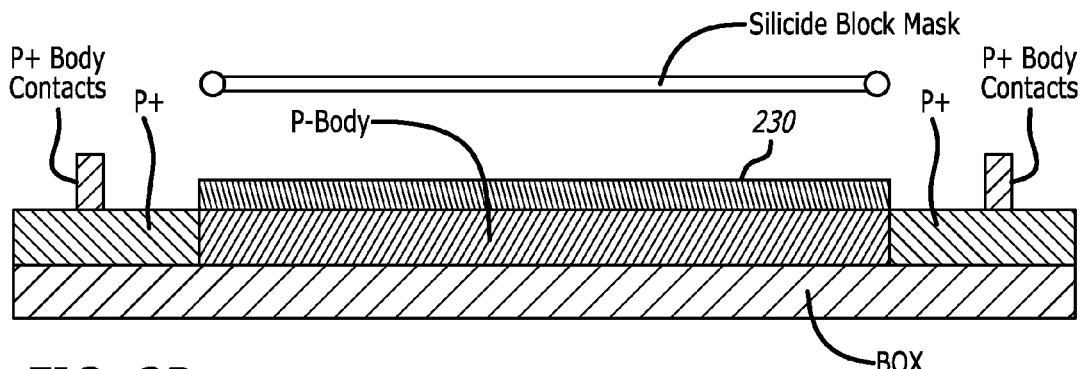
Figure 3C:
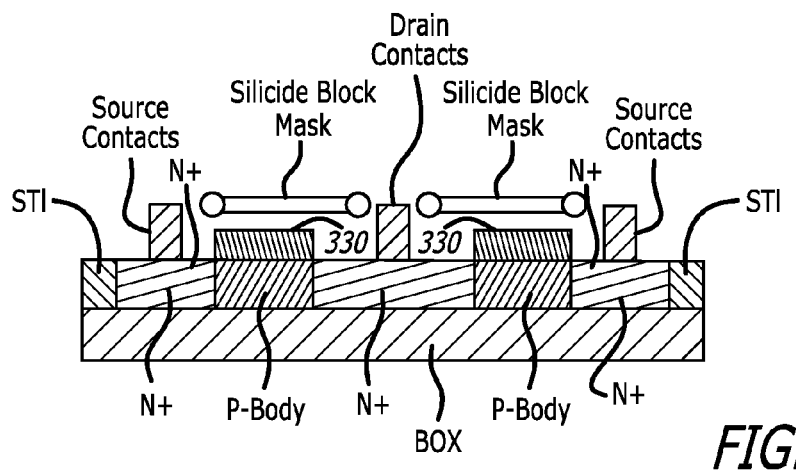
Figure 3D:
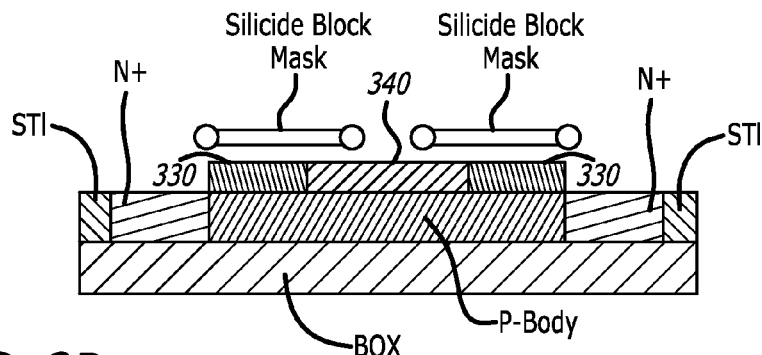

With further reference to FIG. 3A which shows a planar (e.g. top) view of the transverse body coupled SOI MOSFET device according to the various embodiments of the present disclosure, whose various cross sections are depicted in FIGS. 3B-3D, where the silicide block mask (350) can extend across all top regions of the device except the source and the drain contact regions. The person skilled in the art readily realizes that FIG. 3A depicts two adjacent (horizontal) fingers of the multi-finger SOI device which can have a plurality of such fingers, where each finger can comprise a gate polysilicon region (330), a drain region with corresponding drain contacts, and a source region with corresponding source contacts. FIG. 3A also shows the non-symmetrical distance between drain and source contacts to the gate polysilicon (330). In FIG. 3A, the gate polysilicon regions (330) are depicted as horizontal stripes between (e.g. parallel to) the source contacts and the drain contacts of the device fingers. FIGS. 3B, 3C and 3D depict cross sections of the ESD device depicted in FIG. 3A at respective sections marked as 3B, 3C and 3D in FIG. 3B. As known to the person skilled in the art, shallow trench isolation (STI) regions of silicon dioxide shown in FIGS. 3C and 3D are used for isolation between integrated circuit components (note that the STI regions are not shown in FIG. 3A).

With further reference to FIG. 3A, transverse polysilicon stripes (340), which allow for the transverse body coupling of the device fingers, are shown as vertical stripes extending across common drain regions of two adjacent fingers, and joining two corresponding gate polysilicon regions (330). Such transverse polysilicon stripes (340) can create N+ islands surrounded by P− regions underneath the horizontal gate (330) and the transverse polysilicon stripes (340) (e.g. MOSFET P-body), the P− regions providing the coupling of the P-bodies of the adjacent fingers. In other words, the transverse polysilicon stripes (340) and the gate polysilicon (330) can create a mesh of P− wells with N+ islands in the mesh. The person skilled in the art readily knows that doping of an N+ and P− in a semiconductor device can be performed by first implanting the P− body, then depositing a polysilicon layer (e.g. gate polysilicon, transverse polysilicon) and lastly implanting N+ which therefore creates N+ islands surrounded by P− wells underneath the polysilicon that blocked N+ implantation. Such N+ islands inside the device (e.g. MOSFET) P-body can be seen in the various planar views depicted in, for example, FIGS. 4A-4B.

With reference to FIGS. 4A-4B, the N+ islands can be formed in both the drain (i.e. regions (410)) and the source (i.e. regions (412)) N+ implantations, where each region can include one or more contacts (102). During operation of the transverse body coupled device, the N+ islands surrounded by the P− regions can create forward biased P−/N+ source junctions and reverse biased N+/P− drain junctions. The inventors of the present disclosure have established that the forward biased P−/N+ source junction does not influence the device performance and that it is the reverse biased N+/P− drain junction which can control the DCBV and Vt1 of the device. According to the various embodiments of the present disclosure, the non-symmetrical drain and source spacing with respect to the gate of the transverse body coupled ESD device as shown, for example, in FIG. 4B, and the spacing of the polysilicon stripes, can be used to control the performance of the ESD device.

As can be seen in the prior art embodiment depicted in FIG. 4A, the vertical polysilicon stripes (106) can be placed using one of any different pitches (e.g. a same distance between centers of two such consecutive vertical polysilicon stripes), such as a larger pitch in a first exemplary prior art implementation (top configuration of FIG. 4A), and a reduced pitch in a second exemplary prior art implementation (bottom configuration of FIG. 4A). In both such prior art exemplary implementations, a same small size gate length (e.g. (520) of FIG. 5B) is used and therefore a same punch through mode of operation (breakdown mechanism) is provided. Furthermore, both such prior art exemplary implementations have a same smaller dimension of the N+ drain islands, the smaller dimension being defined as the shortest distance between two sides of the N+ drain islands. This is true irrespective of the pitch. As can be seen in the prior art exemplary implementations depicted in FIGS. 5A-5C, such smaller dimension is the vertical length (i.e. length along the vertical polysilicon stripes) of the N+ drain islands. The inventors of the present disclosure have established that such configuration, where the smaller dimension is the vertical length of the N+ drain islands, provides a punch through breakdown mechanism for the transverse body coupled ESD device and therefore does not allow controlling of the Vt1 voltage of the device, via the pitch of the vertical polysilicon stripes (106), in a manner which is decoupled from the DCBV voltage of the device.

FIG. 5B shows an exploded view of a section (5B) of FIG. 5A in which a transverse (vertical) polysilicon stripe (106) and two gates polysilicon (104) can be seen. As depicted in the exploded view of FIG. 5B, the transverse polysilicon stripe (106), which runs vertical to the direction of the gates polysilicon (104), has a width (510), and the gate polysilicon (104) has a width (520) which is the gate length (LG) of the device. As used in the present disclosure, the expressions: gate, gate polysilicon, polysilicon gate, gate region and gate polysilicon region all refer to the same polysilicon structure (104) depicted in FIG. 5B (and other figures), and used, as it is well known to the person skilled in the art, to create the gate (e.g. of a finger) of a transistor.

Figure 6A:
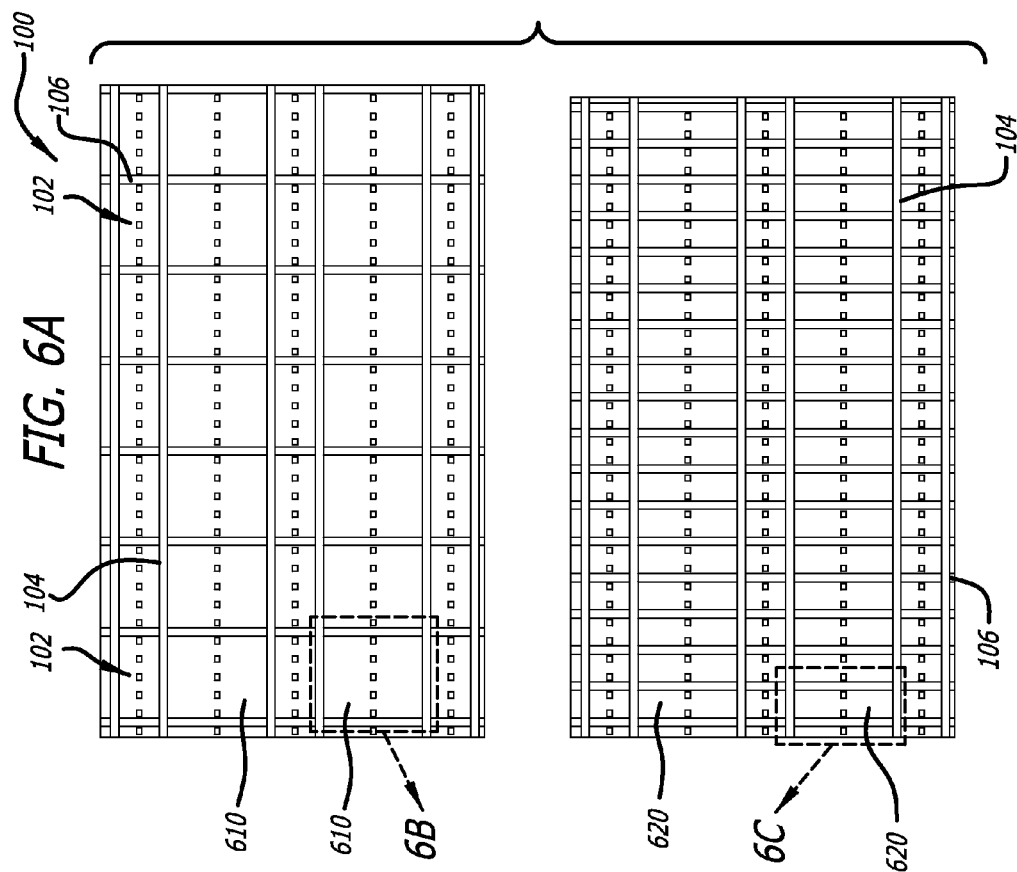
FIGS. 6A-6C show planar views and a cross section view of a non-fully silicided device (e.g. MOSFET) with transverse (vertical) polysilicon stripes according to various embodiments of the present disclosure.
Figure 6B:
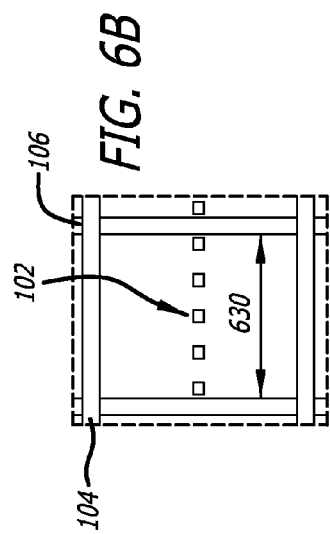
Figure 6C:
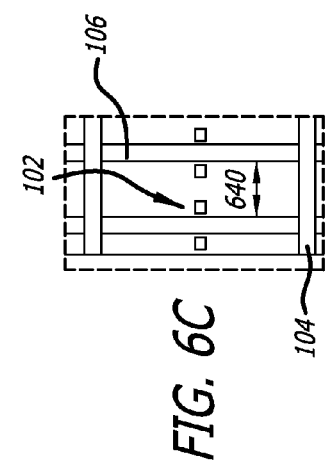

In contrast to the exemplary prior art implementation depicted in FIG. 4A and FIGS. 5A-5C, the smaller dimension of the N+ drain islands according to the various embodiments of the present disclosure can be varied by varying the pitch of the transverse polysilicon stripes. As can be seen in FIG. 4B, due to the larger drain contacts to gate polysilicon spacing of the transverse body coupled device according to teachings of the present disclosure, smaller dimension of the N+ drain islands can be made to be the pitch of the transverse polysilicon stripes (106) which define the horizontal dimension of the N+ drain islands (as shown in FIGS. 6A-6C). According to further embodiments, such smaller dimension can be controlled by the pitch of the transverse polysilicon stripes (106) to be either the transverse dimension of the N+ drain islands (410) for larger pitches of the transverse polysilicon stripes (106), or the horizontal dimension of the N+ drain islands (410) for smaller pitches of the transverse polysilicon stripes (106). As seen in FIG. 4B, the transverse (e.g. vertical) polysilicon stripes (106) can be placed according to some exemplary embodiments of the present disclosure at a relative distance corresponding to five drain contacts (top configuration of FIG. 4B) or two drain contacts (bottom configuration of FIG. 4B). In general, the transverse polysilicon stripes (106) according to the various embodiments of the present disclosure can be placed at a relative distance corresponding to one or more drain contacts (e.g. one or more drain contacts between two consecutive such stripes). Furthermore, although the width of each of the transverse polysilicon stripes (106) in FIG. 4B appear the same as the gate length ($L_G$), a width different from the gate length ($L_G$) is also possible according to further embodiments of the present disclosure.

According to an exemplary embodiment of the present disclosure, the gate length ($L_G$) and the width of the transverse polysilicon stripes (106) can be equal to 400 nm, and the pitch (e.g. center to center distance) of the transverse polysilicon stripes (106) can be equal to 740 nm such as to allow a single contact (e.g. drain contact) between two consecutive transverse stripes. According to another exemplary embodiment of the present disclosure, the gate length ($L_G$) and the width of the transverse polysilicon stripes (106) can be equal to 400 nm, and the pitch (e.g. center to center distance) of the transverse polysilicon stripes (106) can be equal to N×740 nm such as to allow N contacts (e.g. drain contacts) between two consecutive transverse stripes. It should be noted that although the various figures of the present disclosure (e.g. FIGS. 4B, 6A, 7A) show the gate polysilicon (104) as separate areas from the transverse polysilicon stripes (106), according to various embodiments of the present disclosure, structures (104) and (106) can be made of a same polysilicon material formed via a same mask during a fabrication process of the device, which can therefore create a "contiguous" structure which creates the corresponding vertical (106) and horizontal (104) stripes (e.g. mesh). According to other embodiments of the present disclosure, the structures (106) can be made using a separate mask and/or a different material than the mask and the polysilicon used for creating the structures (104).

Figure 11:
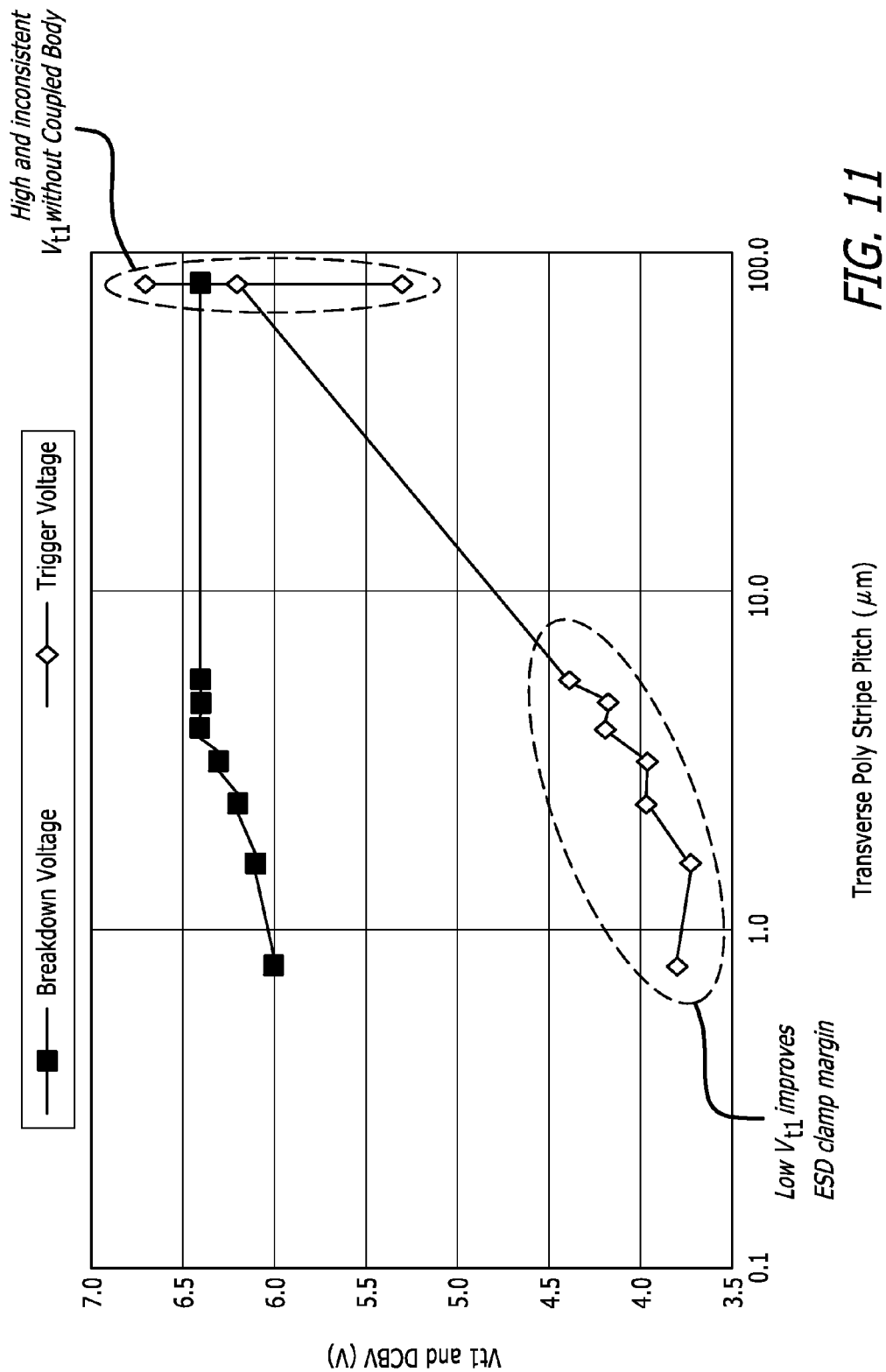
FIG. 11 shows a graph representing the effect of a pitch of the transverse (vertical) polysilicon stripes according to the various embodiments of the present disclosure on a triggering voltage and a direct current breakdown voltage of an ESD device (e.g. SOI MOSFET ESD device).

According to an embodiment of the present disclosure, triggering voltage Vt1 of the transverse body coupled SOI MOSFET device according to the various embodiments of the present disclosure depicted in FIGS. 3A-3D, can be controlled by varying the pitch of the transverse polysilicon stripes (340). As depicted in FIG. 4B and FIGS. 6A-6C, a larger pitch (e.g. (630) of FIG. 6B) can provide a larger minimum dimension (e.g. smaller of the vertical and horizontal dimensions) of the N+ drain islands (410), and a smaller pitch (e.g. (640) of FIG. 6C) can provide a smaller minimum dimension also defined by a horizontal dimension of the N+ drain islands (410). The inventors of the present application have established that the smaller minimum dimension of the N+ drain islands inside of the MOSFET P-body (which comprises the P-body under the gate polysilicon and the P-body under the transverse polysilicon stripes) provides a reduced triggering voltage Vt1 level as compared to the larger minimum dimension of the N+ drain islands. Furthermore, inventors of the present application have established that a corresponding reduction of the direct current breakdown voltage (e.g. as function of the minimum dimension) is substantially less than the reduction of the triggering voltage. Therefore, varying the pitch of the transverse polysilicon stripes of the (transverse) body coupled device according to the present disclosure can reduce the triggering voltage of the device and further distance such triggering voltage from the device's direct current breakdown voltage, as shown in FIG. 11 (later described).

FIGS. 7A-7C show the boundaries of blocking junctions (e.g. reverse bias junctions) created between the N+ drain islands and the P-body wells surrounding the islands created via the transverse polysilicon stripes (106) and the (horizontal) gate polysilicon (104) according to the various embodiments of the present disclosure. As can be seen in FIGS. 7A-7B, such blocking junctions are elliptic in shape with a curvature having a minimum radius (710, 720) which decreases with a reduction in the pitch of the transverse polysilicon stripes (106). FIG. 7B shows the boundaries of blocking junctions for a larger pitch size of the transverse polysilicon stripes (106), while FIG. 7C shows such boundaries for a smaller pitch size. Inventors of the present disclosure have established that such (minimum) curvature radius can affect an electric field created at the blocking junctions under influence of an ESD transient event. In particular, it was noted that the smaller the curvature radius of the blocking junctions, the higher a corresponding electric field can be, which consequently can provide a smaller Vt1 triggering voltage with only marginal reduction in the DCBV voltage. The pitch of the transverse polysilicon stripes according to the teachings of the present disclosure can be used to shape the curvature of the blocking junctions between the N+ drain islands and the P-body wells underneath the transverse polysilicon stripes. As mentioned in the previous sections of the present disclosure, the inventors have established that the forward biased P−/N+ blocking junctions created between the N+ source islands (e.g. regions (412) of FIG. 4B) and the P-body wells surrounding the islands via the transverse polysilicon stripes (106) do not affect either the DCBV voltage or the Vt1 voltage of the transverse body coupled device of the present teachings (FIG. 1C with transverse polysilicon stripes).

Although the various embodiments of the present disclosure described above suggest usage of a plurality of transverse polysilicon stripes, according to a further embodiment of the present disclosure a single transverse polysilicon stripe extending across the one or more fingers of the transistor can be used. Such single transverse polysilicon stripe can be used, for example, in a case where the gate finger width of the transistor is small (e.g. length in the horizontal direction of the gate polysilicon) and therefore fewer such transverse stripes can be fitted along the width of the gate finger. This is depicted in FIG. 7D, where a corresponding N+ drain island (shown with corresponding drain contacts) is surrounded by two gate polysilicon regions (104) and one transverse (e.g. vertical) polysilicon stripe (106) on one side, and a vertical non-conductive region (770) on the opposite side (e.g. end of fingers) of the transverse polysilicon stripe (106). Inventors of the present disclosure have established that a corresponding blocking junction, as depicted in the FIG. 7D, has boundaries with curvatures similar to the case where the vertical non-conductive region (770) is replaced with another transverse polysilicon stripe (106), and therefore the same advantages as using multiple transverse polysilicon stripes and described in the present disclosure can be obtained in a reduced size ESD device using a single transverse polysilicon stripe. The person skilled in the art readily understands processes involved in the fabrication and sizing of transistors, and is therefore familiar with expressions such as gate polysilicon, gate length, finger, finger width, doping, drain/source junction, reverse/forward biased junction and other related expressions used in the present application.

As mentioned in the above sections of the present disclosure, the inventors have established that the forward biased P−/N+ source junction does not influence the proposed transverse body coupled device performance and that it is the reverse biased N+/P− drain junction which can control the DCBV and Vt1 of the device (i.e. via spacing of the transverse polysilicon stripes). Accordingly, transverse polysilicon stripes can be made to extend across common drain regions of two adjacent fingers without reaching the source regions of the fingers and still affect (e.g. change), via their relative spacing, the shape of the reverse biased N+/P− drain junction, and therefore control the DCBV and Vt1 of the device.

Figure 8:
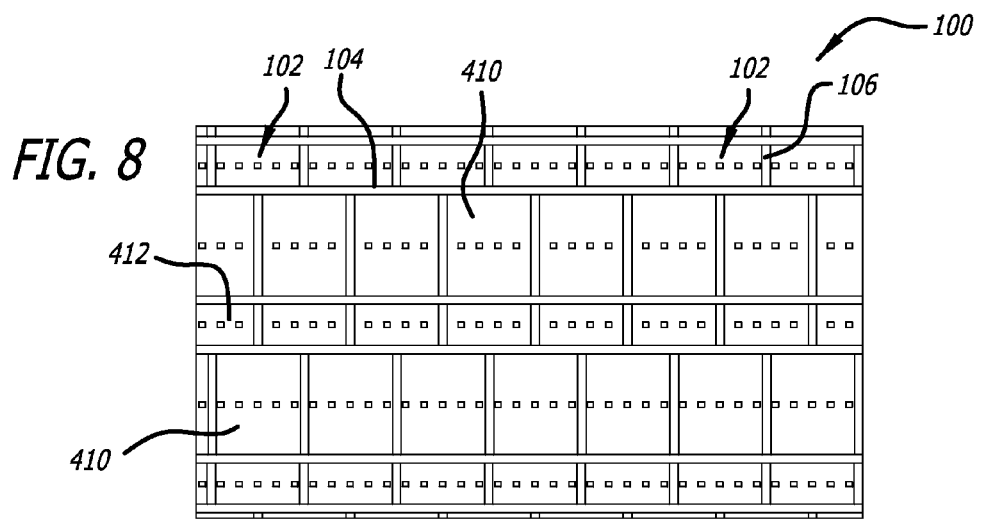
FIGS. 8-10 show planar views of a non-fully silicided device (e.g. SOI MOSFET) according to various exemplary embodiments of the present disclosure where the transverse polysilicon stripes, in combination with the gates polysilicon, form different patterns.
Figure 9:
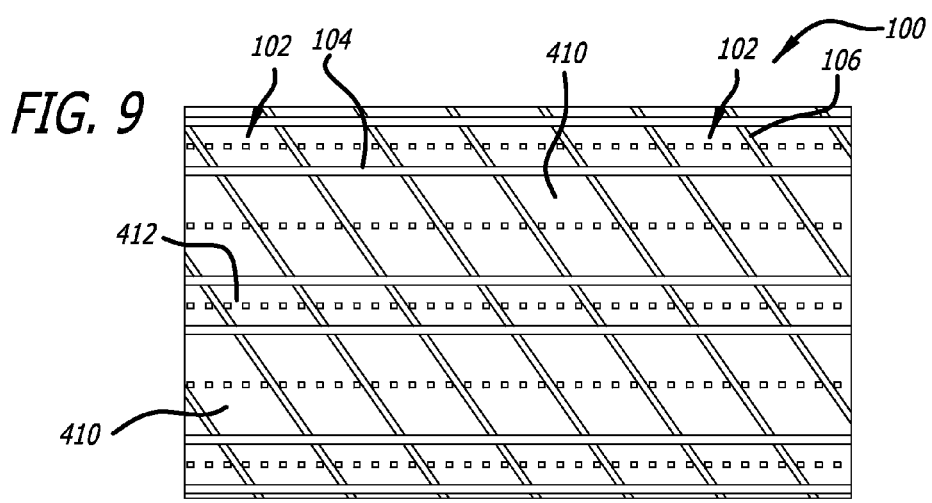
Figure 10:
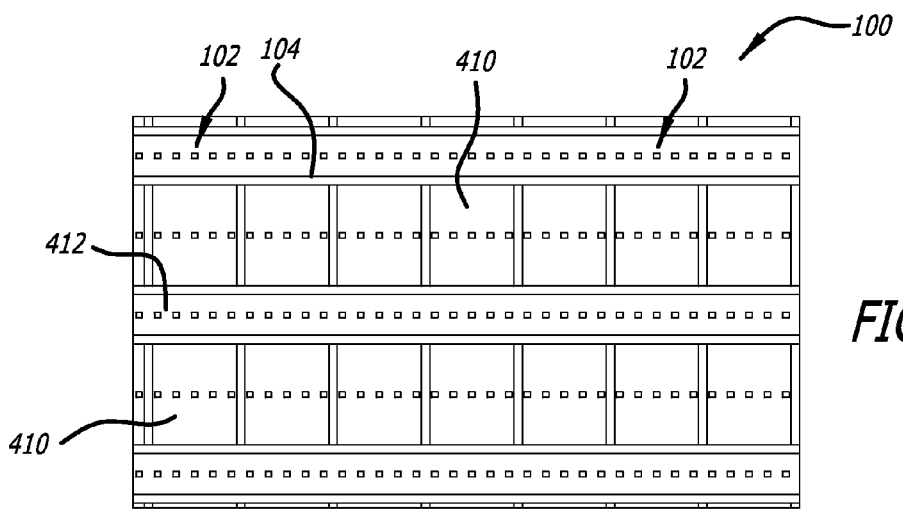

FIGS. 8-10 show various exemplary embodiments according to the present disclosure where transverse polysilicon stripes are used to affect the reverse biased N+/P− drain junction. As can be seen in such figures (planar views, as in FIGS. 6A-6C), the transverse polysilicon stripes (106) can form a brick pattern as depicted in FIG. 8, can extend diagonally across the various drain (410) and source (412) regions of the fingers of the device, as depicted in FIG. 9, or can create only drain islands within the various drain regions (410) by not crossing any source region (412) as depicted in FIG. 10. Varying the spacing of the polysilicon stripes depicted in FIGS. 8-10 can equally influence the DCBV voltage and Vt1 voltage as described with respect to the previous embodiments according to the present disclosure. It should be noted that the various exemplary embodiments according to the teachings of the present disclosure for providing transverse polysilicon stripes as depicted, for example, in FIGS. 6A and 8-10, should not be considered as limiting the scope of the invention. The person skilled in the art can readily apply such teachings to create variants of the exemplary embodiments according to the present disclosure depicted in FIGS. 6A and 8-10, where polysilicon stripes are used to control the shape of reverse biased N+/P− drain junctions.

FIG. 11 shows the effect of varying the pitch (e.g. center to center distance) of the transverse polysilicon stripes according to the various embodiments of the present disclosure, on the triggering voltage Vt1 (indicated as ◇) and direct current breakdown voltage DCBV (indicated as ■) of an exemplary ESD device. Such exemplary ESD device according to an embodiment of the present disclosure can be the ESD device whose circuital configuration is depicted in FIG. 1C, and comprising the transverse body coupled device (e.g. SOI MOSFET) presented in the various embodiments of the present disclosure (using transverse polysilicon stripes). As previously noted with reference to FIG. 1C, such ESD device without the transverse body coupled device (not using the transverse polysilicon stripes) can have a high and inconsistent triggering voltage Vt1. This can be seen in the graph of FIG. 11, where for large values of the pitch (e.g. ~100 µm which can be considered as comprising no transverse body coupling), the device has high and inconsistent Vt1 values (e.g. between 5.3 V and 6.7 V), and a DCBV voltage of about 6.4 V. As seen by the graph point denoted as P2 in FIG. 11, introducing transverse body coupling (e.g. transverse polysilicon stripes) to the transistor device (e.g. SOI MOSFET) of the ESD device according to the various teachings of the present disclosure with a pitch of around 4.7 µm (e.g. 4.68 µm), can produce a consistent Vt1 voltage at about 4.2 V with no impact on the DCBV voltage. Therefore, polysilicon stripes according to the various embodiments of the present disclosure at a spacing (distance measured with respect to the center of each of the transverse polysilicon stripes) of around 4.7 µm (e.g. 4.68 µm) lower the Vt1 voltage by about 2 V without affecting the DCBV voltage. As depicted in the graph of FIG. 11, the same trend can be seen for lower values of the pitch, where Vt1 decreases as a function of the pitch and almost independently of the DCBV voltage. Other points, such as points denoted as P1 and P3, in the graph of FIG. 11 show similar properties where the Vt1 voltage is reduced with minimal impact on the DCBV voltage. For example, point P1 in the graph of FIG. 11 corresponds to a pitch of around 0.8 µm (e.g. 0.78 µm) which results in a Vt1 voltage of about 3.8 V with a slight dip in the DCBV voltage, and point P3 in the graph of FIG. 11 corresponds to a pitch of around 5.5 µm (e.g. 5.46 µm) which results in a Vt1 voltage of about 4.4 V with negligible impact on the DCBV voltage. A range of usable pitches for which Vt1 is varied with minimal effect on the DCBV voltage can be estimated to be the range of 0.6 µm to 8 µm.

Figure 12:
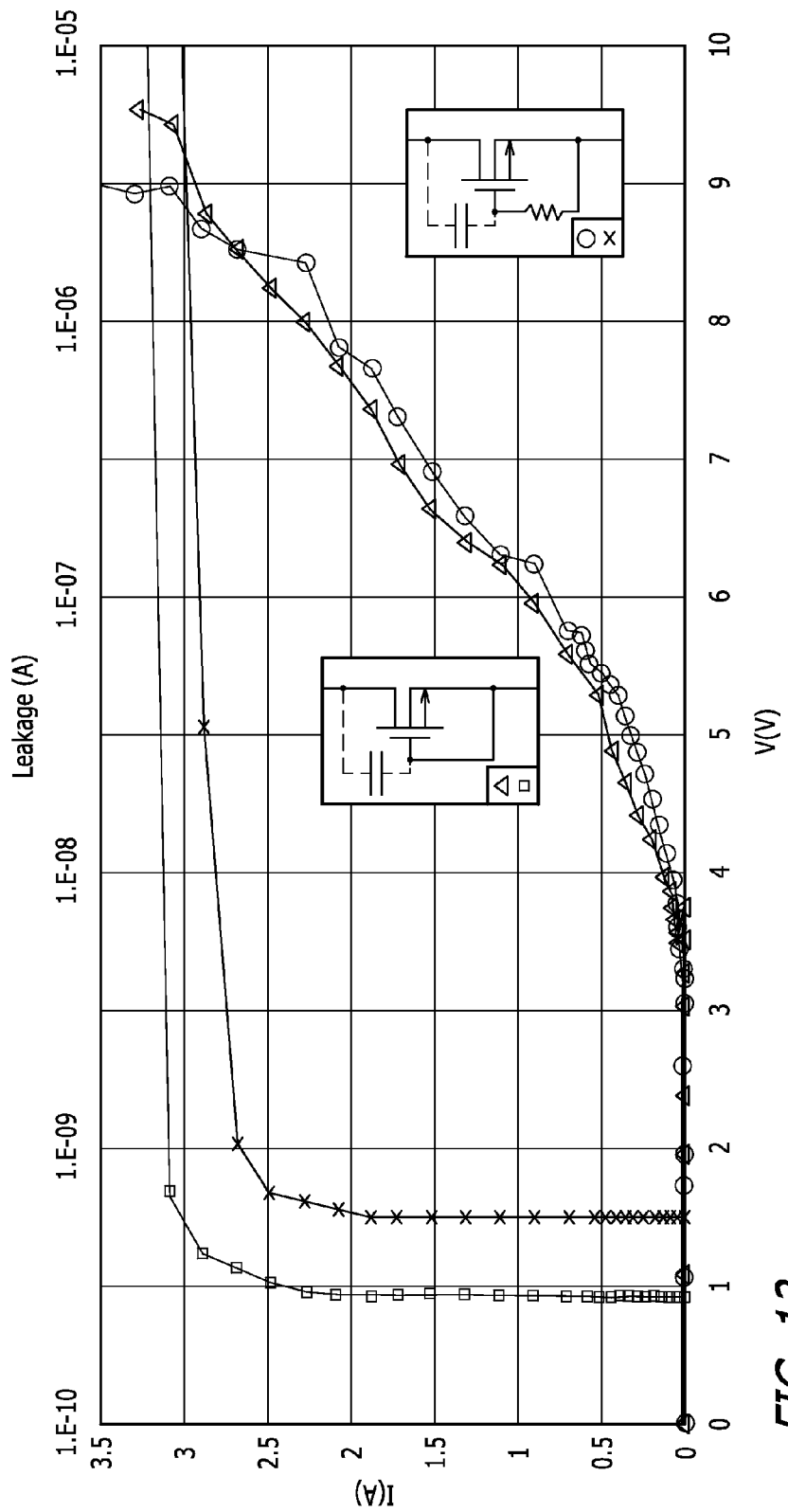
FIG. 12 shows graphs representing performance of an ESD device (e.g. SOI MOSFET ESD device) according to the various embodiments of the present disclosure and performance of a prior art SOI MOSFET ESD device.

FIG. 12 contrasts the TLP measurement of the ESD device depicted in FIG. 1C with the transverse body coupled SOI MOSFET (plotted using "Δ" for the triggering voltage and "□" for the leakage current) according to the various teachings of the present disclosure and the ESD device depicted in FIG. 1D (e.g. without transverse body coupling stripes) (plotted using "○" for the triggering voltage and "x" for the leakage current). As can be seen in FIG. 12, the transverse body coupled SOI MOSFET according to the various teachings of the present disclosure can provide a desirable TLP measurement similar to one provided by the ESD device of FIG. 1D but without the high RC constant (e.g. 5000 times smaller). The person skilled in the art readily appreciates the advantages provided by the teachings of the present disclosure which can lower and stabilize the Vt1 voltage level of an ESD device while increasing a margin provided by a difference in voltage levels between the Vt1 level and the DCBV level.

Figure 13:
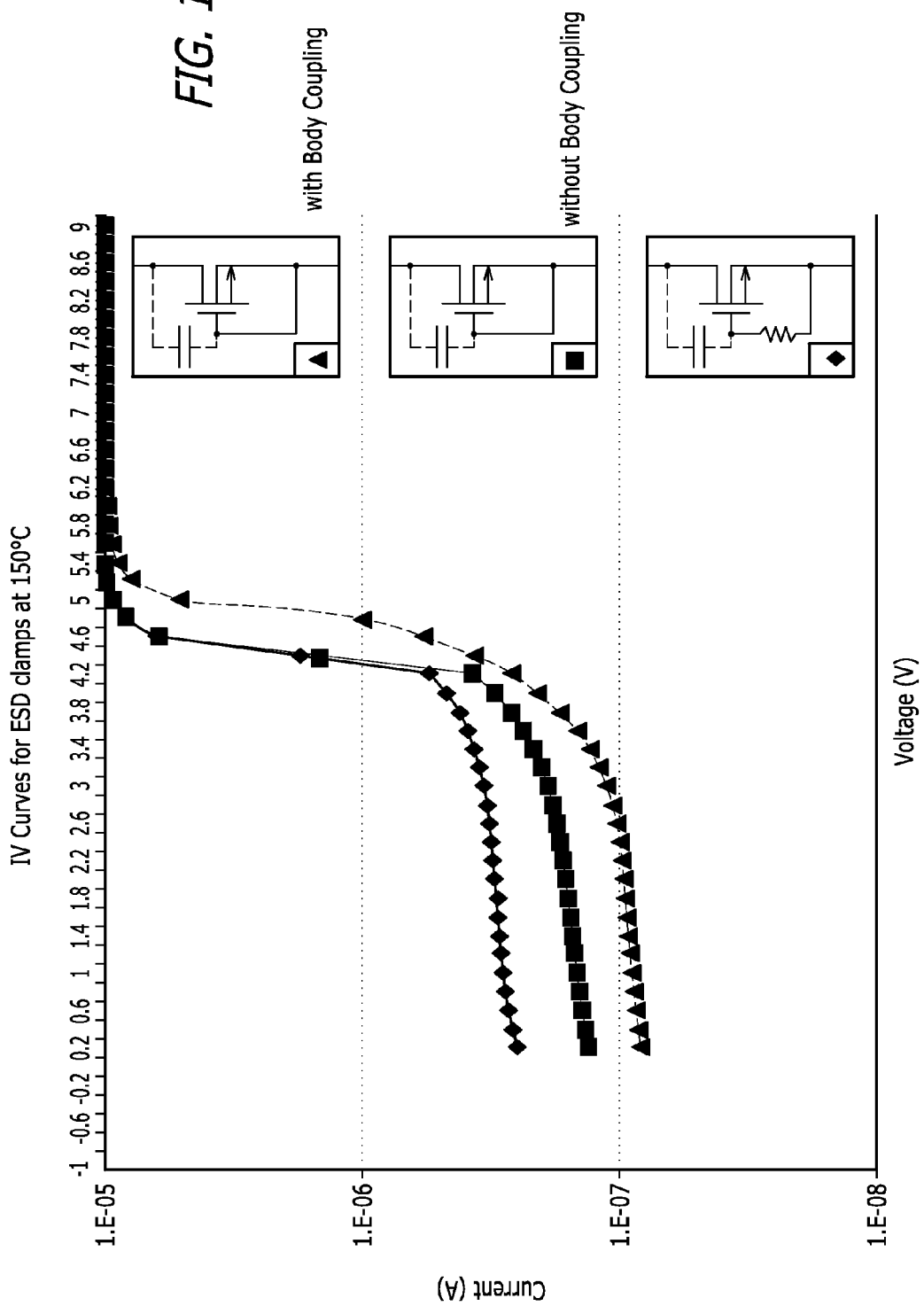
FIG. 13 shows IV curves measured at 150° C. on the various embodiments of the present disclosure and of the prior art ESD devices (e.g. SOI MOSFET ESD devices). The curve corresponding to the new invented device shows higher DCBV and lower leakage current than other ESD devices of comparable size.

FIG. 13 shows another advantage of the present disclosure. FIG. 13 shows I-V graphs of the ESD device according to the various embodiments of the present disclosure (ESD device of FIG. 1C with transverse body coupling, represented by the symbol ▲ in the corresponding graph) and prior art ESD devices (ESD device of FIG. 1C without transverse body coupling, represented by the symbol ■ and ESD device of FIG. 1D, represented by the symbol ◆ in the corresponding graphs) at an ESD device operating temperature of 150° C. As can be seen by the graphs of FIG. 13 and the corresponding Table 2 below, the ESD device according to the various embodiments of the present disclosure (FIG. 1C with transverse body coupling) exhibits the lowest leakage current and the highest DCBV for I-V behavior at elevated temperature of 150° C. when compared against other designs of the same physical area. For example, at an operating voltage of 3.6 V, as shown by the data in Table 2 below, leakage current is the lowest (i.e. 147 nA), and the DCBV voltage at 1 µA is highest (i.e. 4.8 V) for the device according to the present disclosure.

TABLE 2

High Temperature (150° C.) DC Sweeps Results

| Clamp | DCBV(V) at 1 µA | I-leak(nA) at 3.6 V |
|---|---|---|
| FIG. 1D: Low Vt1/Low I-leak/High RC | 4.4 | 390 |
| FIG. 1C: High Vt1/Low I-leak/Inconsistent Vt1 (without transverse polysilicon stripes) | 4.4 | 237 |
| FIG. 1C: Low Vt1/Low I-leak/Consistent Vt1 (with transverse polysilicon stripes, according to the present invention) | 4.8 | 147 |

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. An electrostatic discharge (ESD) protection device comprising a multiple fingers field-effect transistor (FET), the ESD protection device being configured to exhibit, during operation, a trigger voltage and a direct current breakdown voltage, wherein a finger of the multiple fingers FET comprises:
    a drain implantation region and corresponding drain contacts;
    a source implantation region and corresponding source contacts;
    a gate polysilicon region of length $L_G$; and
    a plurality of transverse polysilicon stripes formed atop the drain implantation region and connected to the gate polysilicon region,
    and wherein:
        the gate length $L_G$ is chosen such that, during operation of the ESD protection device under an ESD event, a Zener breakdown mode of operation of the ESD protection device is provided, and
        a spacing between two consecutive transverse polysilicon stripes is configured to control the trigger voltage independently from the direct current breakdown voltage.

2. The ESD protection device of claim 1, wherein:
    the drain implantation region is a common drain implantation region of the finger and a first adjacent finger, and
    at least one transverse polysilicon stripe of the plurality of transverse polysilicon stripes extends across the common drain implantation region and connects to the gate polysilicon region of the first adjacent finger.

3. The ESD protection device of claim 2, wherein:
    the source implantation region is a common source implantation region of the finger and a second adjacent finger different from the first adjacent finger, and
    the at least one transverse polysilicon stripe of the plurality of transverse polysilicon stripes further extends across the common source implantation region.

4. The ESD protection device of claim 2, wherein the at least one transverse polysilicon stripe of the plurality of transverse polysilicon stripes connects to the gate polysilicon region of the finger at a first position along a width of the finger, and connects to the gate polysilicon region of the first adjacent finger at a second position along the width of the first adjacent finger, the first position being different from the second position.

5. The ESD protection device of claim 1, wherein the FET comprises non-silicided top regions.

6. The ESD protection device of claim 5, wherein the non-silicided top regions of the MOSFET in correspondence of the finger of the multiple fingers comprise a top region of the gate polysilicon region, a top region of the source implantation region except of a region associated to the source contacts, and a top region of the drain implantation region except of a region associated to the drain contacts.

7. The ESD protection device of claim 6, wherein the non-silicided top regions of the FET in correspondence of the finger of the multiple fingers is a contiguous region formed by a rectangular silicide block mask.

8. The ESD protection device of claim 1, wherein the spacing between the drain contacts and the gate polysilicon region is two to six times the spacing between the source contacts and the gate polysilicon region.

9. The ESD protection device of claim 8, wherein the gate length $L_G$ is larger than 100 nm.

10. The ESD protection device of claim 9, wherein a width of a transverse polysilicon stripe of the plurality of transverse polysilicon stripes is equal to the gate length $L_G$.

11. The ESD protection device of claim 10, wherein the gate length is 400 nm.

12. The ESD protection device of claim 1, wherein the FET is a metal-oxide-semiconductor FET (MOSFET).

13. The ESD protection device of claim 12, wherein the MOSFET is one of: a) a silicon-on-insulator (SOI) MOSFET, b) a silicon-on-sapphire (SOS) MOSFET, and c) bulk silicon MOSFET.

14. The ESD protection device of claim 13, wherein the ESD protection device comprises two terminals, a first terminal connected to the source contacts and gate polysilicon regions of the multiple fingers of the MOSFET, and a second terminal connected to the drain contacts of the multiple fingers of the MOSFET.

15. The ESD protection device of claim 14, wherein the MOSFET further comprises a body connection to the first terminal.

16. The ESD protection device of claim 15, wherein the source implantation regions and the drain implantation regions are N+ doped regions and the body connection is a P-type connection.

17. The ESD protection device of claim 16, wherein gate polysilicon regions of the plurality of fingers and the transverse polysilicon stripes create a mesh of P− wells with N+ islands between the mesh.

18. The ESD protection device of claim 17, wherein a horizontal dimension of the N+ islands is based on the spacing between two consecutive transverse polysilicon stripes and a vertical dimension of the N+ islands is based on a spacing between two consecutive gate polysilicon regions of two consecutive fingers of the plurality of fingers.

19. The ESD protection device of claim 18, wherein the horizontal dimension of the N+ islands in correspondence of the drain implantation regions is smaller than the vertical dimension.

20. The ESD protection device of claim 19, wherein the spacing between two consecutive transverse polysilicon stripes, based on center lines of the transverse polysilicon stripes, is in a range R, where 0.6 µm≤R≤8 µm.

21. The ESD protection device of claim 19, wherein the spacing between two consecutive transverse polysilicon stripes, based on center lines of the transverse polysilicon stripes, is equal to 0.78 µm.

22. The ESD protection device of claim 20, wherein the direct current breakdown voltage varies between 6.0 V and 6.4 V over the range R.

23. The ESD protection device of claim 22, wherein the trigger voltage is below 4.5 V and the direct current breakdown voltage is equal to or above 6.0 V.

24. An integrated circuit comprising the ESD protection device of claim 14.

25. The integrated circuit of claim 24, wherein the ESD protection device is coupled via the first terminal and the second terminal to control lines of the integrated circuit.

26. A method for controlling a triggering voltage of an electrostatic discharge (ESD) protection device independently of a direct current breakdown voltage of the ESD protection device, the ESD protection device comprising a multiple fingers field-effect transistor (FET), the method comprising:
forming, via a fabrication step of the FET, a plurality of transverse polysilicon stripes atop drain implantation regions of the FET; and
controlling, via a spacing between two consecutive transverse polysilicon stripes, the triggering voltage independently of the direct current breakdown voltage.

27. The method of claim 26, further comprising:
changing, via the spacing between the two consecutive transverse polysilicon stripes, a shape of reverse biased N+/P− drain junctions, wherein the drain implantation regions are N+ doped regions.

28. The method of claim 26, wherein the two consecutive transverse polysilicon stripes connect to gate polysilicon regions of two adjacent fingers of the multiple fingers.

29. The method of claim 26, wherein:
the FET is a metal-oxide-semiconductor FET (MOSFET);
a gate length of the MOSFET transistor is configured to provide Zener breakdown mode of operation of the ESD device, and
a spacing between drain contacts of a finger of the multiple fingers and a gate polysilicon region of the finger is multiple times a spacing between source contacts of the finger and the gate polysilicon region of the finger.

30. The method of claim 29, further comprising:
forming, via a silicide block mask, non-silicided formation of top regions of the MOSFET.

31. The method of claim 30, wherein the top regions of the MOSFET comprise a top region of the gate polysilicon region, a top region of the source implantation regions except of a region associated to source contacts of a finger of the multiple fingers, and a top region of the drain implantation regions except of a region associated to drain contacts of a finger of the multiple fingers.

32. The method of claim 31, wherein the non-silicided formation of top regions of the MOSFET in correspondence of a finger of the multiple fingers is a contiguous region formed by a rectangular block of the silicide block mask.

33. The method of claim 29, wherein the MOSFET is one of: a) a silicon-on-insulator (SOI) MOSFET, and b) a bulk silicon MOSFET.

34. The method of claim 29, wherein the MOSFET is a silicon-on-sapphire (SOS) MOSFET.

35. An electrostatic discharge (ESD) protection device comprising a multiple fingers field-effect transistor (FET), the ESD protection device being configured to exhibit, during operation, a trigger voltage and a direct current breakdown voltage, wherein a finger of the multiple fingers FET comprises:
a drain implantation region and corresponding drain contacts;
a source implantation region and corresponding source contacts;
a gate polysilicon region of length $L_G$; and
at least one transverse polysilicon stripe formed atop the drain implantation region and connected to the gate polysilicon region,
and wherein:
the gate length $L_G$ is chosen such that, during operation of the ESD protection device under an ESD event, to provide a Zener breakdown mode of operation of the ESD protection device, and
a position of the at least one transverse polysilicon stripe defined by an intersection of the at least one transverse polysilicon stripe with the gate polysilicon region is configured to control the trigger voltage independently from the direct current breakdown voltage.

36. The ESD protection device of claim 35, wherein:
the drain implantation region is a common drain implantation region of the finger and a first adjacent finger, and
the at least one transverse polysilicon stripe extends across the common drain implantation region and connects to the gate polysilicon region of the adjacent finger.

37. The ESD protection device of claim 36, wherein:
the source implantation region is a common source implantation region of the finger and a second adjacent finger different from the first adjacent finger, and
the at least one transverse polysilicon stripe further extends across the common source implantation region.

38. The ESD protection device of claim 37, wherein the at least one transverse polysilicon stripe connects to the gate polysilicon region of the finger at a first position along a width of the finger, and connects to the gate polysilicon region of the first adjacent finger at a second position along the width of the first adjacent finger, the first position being different from the second position.

39. The ESD protection device of claim 35, wherein the spacing between the drain contacts and the gate polysilicon region is two to six times the spacing between the source contacts and the gate polysilicon region.

40. The ESD protection device of claim 35, wherein the gate length $L_G$ is larger than 100 nm.

41. The ESD protection device of claim 40, wherein a width of the at least one transverse polysilicon stripe is equal to the gate length $L_G$.

42. The ESD protection device of claim 41, wherein the gate length $L_G$ is 400 nm.

43. The ESD protection device of claim 35, wherein the FET is a metal-oxide-semiconductor FET (MOSFET).

44. The ESD protection device of claim 43, wherein the MOSFET is one of: a) a silicon-on-insulator (SOI) MOSFET, and b) a bulk silicon MOSFET.

45. The ESD protection device of claim 43, wherein the MOSFET is a silicon-on-sapphire (SOS) MOSFET.

46. The ESD protection device of claim 43, wherein the ESD protection device comprises two terminals, a first terminal connected to the source contacts and gate polysilicon regions of the multiple fingers of the MOSFET, and a second terminal connected to the drain contacts of multiple fingers of the MOSFET.

47. The ESD protection device of claim 46, wherein the MOSFET comprises a body connection to the first terminal.

* * * * *